(12) United States Patent
Feng et al.

(10) Patent No.: US 11,568,790 B2
(45) Date of Patent: Jan. 31, 2023

(54) SHIFT REGISTER FOR RANDOM COMPENSATION FOR SUB-PIXEL ROW, DRIVING METHOD THEREOF, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/648,515

(22) PCT Filed: Jan. 2, 2019

(86) PCT No.: PCT/CN2019/070064
§ 371 (c)(1),
(2) Date: Mar. 18, 2020

(87) PCT Pub. No.: WO2020/140195
PCT Pub. Date: Jul. 9, 2020

(65) Prior Publication Data
US 2021/0217349 A1 Jul. 15, 2021
US 2022/0059013 A9 Feb. 24, 2022

(51) Int. Cl.
*G09G 5/00* (2006.01)
*G09G 3/20* (2006.01)
(Continued)

(52) U.S. Cl.
CPC ......... *G09G 3/2092* (2013.01); *G09G 3/3266* (2013.01); *G09G 3/3677* (2013.01);
(Continued)

(58) Field of Classification Search
CPC ......... G09G 3/2092; G09G 2310/0286; G09G 2300/0426; G09G 2310/061;
(Continued)

(56) References Cited

U.S. PATENT DOCUMENTS

| 11,227,549 B2 | 1/2022 | Feng et al. | |
| 2008/0187089 A1* | 8/2008 | Miyayama | G11C 19/28 377/79 |

(Continued)

FOREIGN PATENT DOCUMENTS

| CN | 108682397 A | 10/2018 |
| CN | 108806597 A | 11/2018 |

(Continued)

OTHER PUBLICATIONS

European Extended Search Report, Application No. 19861282.2, dated Jul. 19, 2022, 10 pps.

*Primary Examiner* — Adam J Snyder
(74) *Attorney, Agent, or Firm* — Armstrong Teasdale LLP

(57) ABSTRACT

A shift register is provided, which may include a compensation selection circuit, a holding circuit, and N shift register circuits. The hold circuit may hold a blanking input signal. Each of the shift register circuits may include a blanking input circuit and an output circuit. The blanking input circuit may provide a blanking pull-down signal to a first node according to the blanking input signal and a blanking control signal. The output circuit may output a shift signal via a shift signal output terminal and output a first drive signal via a first drive signal output terminal according to a voltage of the first node. The compensation selection circuit may
(Continued)

provide, according to a compensation selection control signal and the shift signal from one of the N shift register circuits, the blanking input signal to the holding circuit and the N shift register circuits.

18 Claims, 9 Drawing Sheets

(51) Int. Cl.
G09G 3/36 (2006.01)
G09G 3/3266 (2016.01)
G11C 19/28 (2006.01)

(52) U.S. Cl.
CPC ............... *G09G 2300/0426* (2013.01); *G09G 2310/0286* (2013.01); *G09G 2310/061* (2013.01); *G09G 2310/08* (2013.01); *G11C 19/28* (2013.01)

(58) Field of Classification Search
CPC ............. G09G 2310/08; G09G 3/3677; G09G 3/3266; G11C 19/28
See application file for complete search history.

(56) References Cited

U.S. PATENT DOCUMENTS

| | | | |
|---|---|---|---|
| 2015/0036784 A1* | 2/2015 | Qing | G09G 3/3233 377/68 |
| 2016/0049107 A1* | 2/2016 | Hsu | G09G 3/20 345/212 |
| 2016/0049116 A1* | 2/2016 | Cao | G09G 3/3266 345/213 |
| 2016/0064098 A1* | 3/2016 | Han | G09G 3/3225 345/211 |
| 2017/0186352 A1* | 6/2017 | Lin | G09G 3/20 |
| 2018/0337682 A1* | 11/2018 | Takasugi | G09G 3/3266 |
| 2019/0103049 A1* | 4/2019 | Noh | G09G 3/3266 |
| 2020/0035316 A1 | 1/2020 | Feng et al. | |
| 2021/0335198 A1 | 10/2021 | Feng et al. | |

FOREIGN PATENT DOCUMENTS

| | | | | |
|---|---|---|---|---|
| CN | 108806611 A | | 11/2018 | |
| KR | 10 20170078978 A | * | 7/2017 | ........... G09G 3/3266 |

* cited by examiner

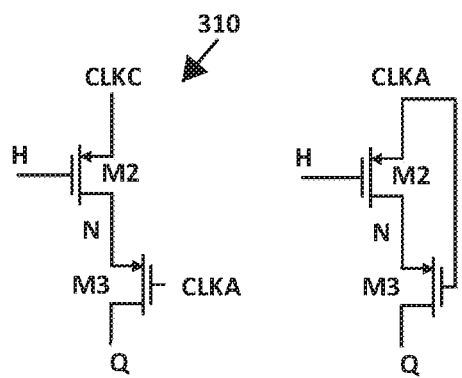
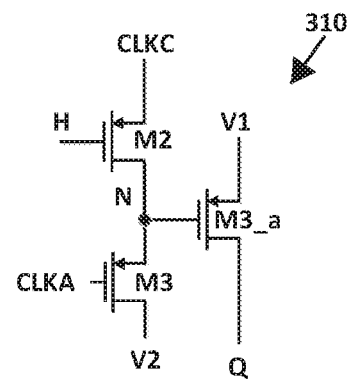
FIG. 4A  FIG. 4B  FIG. 4C
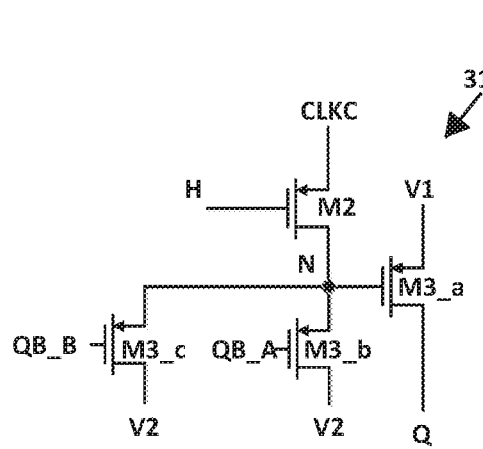
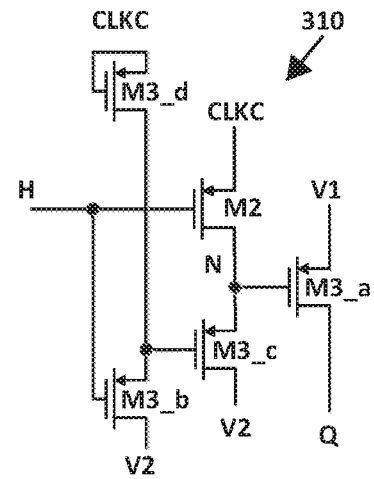
FIG. 4D  FIG. 4E
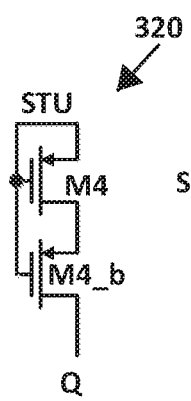
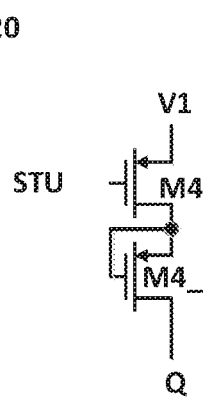
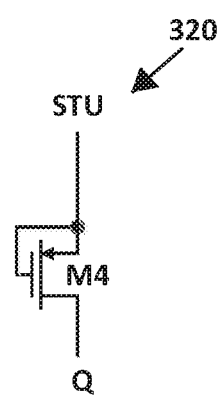
FIG. 5A  FIG. 5B  FIG. 5C

SHIFT REGISTER FOR RANDOM COMPENSATION FOR SUB-PIXEL ROW, DRIVING METHOD THEREOF, GATE DRIVING CIRCUIT, AND DISPLAY DEVICE

CROSS REFERENCE TO RELATED APPLICATIONS

This patent application is a National Stage Entry of PCT/CN2019/070064 filed on Jan. 2, 2019, the disclosure of which is incorporated by reference herein in its entirety as part of the present application.

BACKGROUND

The present disclosure relates to the field of display technologies, and in particular, to a shift register and a driving method thereof, a gate driving circuit, an array substrate, and a display device.

In Gate Driver on Array (GOA) technology, a gate driving circuit is manufactured on an array substrate to realize the function of scanning pixel circuits row by row. The gate driving circuit may include a plurality of cascaded shift registers. A scan signal is output from an output terminal of the shift register to drive the pixel circuit, while a cascaded signal is output to drive a next-stage shift register.

In the display field, especially in organic light-emitting diode (OLED) display devices, the gate driving circuit is currently integrated in a gate driving chip. In chip design, an area of the chip is the main factor affecting cost of the chip. Generally, the gate driving circuit includes a sensing circuit, a scanning circuit, and a connection circuit (for example, an OR circuit) connecting an output of the sensing circuit and an output of the scanning circuit. The structure of the gate driving circuit is very complicated, such that it is difficult to meet requirements of high resolution and narrow margin.

Brief Description

Embodiments of the present disclosure provide a shift register and a driving method thereof, a gate driving circuit, an array substrate, and a display device.

A first aspect of the present disclosure provides a shift register. The shift register may include a compensation selection circuit, a holding circuit, and N shift register circuits. The holding circuit is configured to hold a blanking input signal. Each of the N shift register circuits includes a blanking input circuit configured to provide a blanking pull-down signal to a first node according to the blanking input signal and a blanking control signal, an output circuit configured to output a shift signal via a shift signal output terminal and output a first drive signal via a first drive signal output terminal, according to a voltage of the first node. The compensation selection circuit is configured to provide, according to a compensation selection control signal and the shift signal from one of the N shift register circuits, the blanking input signal to the holding circuit and the N shift register circuits via a first control node. N is a natural number greater than 1.

In an embodiment of the present disclosure, the holding circuit includes a first capacitor. A first end of the first capacitor is coupled to the first control node. Another end of the first capacitor is coupled to a second voltage terminal to receive a second voltage.

In an embodiment of the present disclosure, the compensation selection circuit includes a first transistor. A control electrode of the first transistor is coupled to a compensation selection control signal terminal to receive the compensation selection control signal. A first electrode of the first transistor is coupled to the shift signal output terminal of the one of the N shift register circuits. A second electrode of the first transistor is coupled to the first control node.

In an embodiment of the present disclosure, the blanking input circuit includes a second transistor and a third transistor. A control electrode of the second transistor is coupled to the first control node, a first electrode of the second transistor is coupled to a first voltage terminal to receive a first voltage as the blanking pull-down signal, and a second electrode of the second transistor is coupled to a first electrode of the third transistor. A control electrode of the third transistor is coupled to a first clock signal terminal to receive a first clock signal as the blanking control signal, and a second electrode of the third transistor is coupled to the first node.

In an embodiment of the present disclosure, the output circuit includes a nineteenth transistor, a twenty-second transistor, and a second capacitor. A control electrode of the nineteenth transistor is coupled to the first node, a first electrode of the nineteenth transistor is coupled to a fourth clock signal terminal to receive a fourth clock signal, and a second electrode of the nineteenth transistor is coupled to the shift signal output terminal. A control electrode of the twenty-second transistor is coupled to the first node, a first electrode of the twenty-second transistor is coupled to the fourth clock signal terminal to receive the fourth clock signal, and a second electrode of the twenty-second transistor is coupled to the first drive signal output terminal. The second capacitor is coupled between the first node and the shift signal output terminal.

In an embodiment of the present disclosure, each of the shift register circuits further includes a display input circuit. The display input circuit is configured to provide a display pull-down signal to the first node according to a display input signal.

In an embodiment of the present disclosure, the display input circuit includes a fourth transistor. A control electrode of the fourth transistor is coupled to a display input signal terminal to receive the display input signal, a first electrode of the fourth transistor is coupled to a first voltage terminal to receive a first voltage as the display pull-down signal, and a second electrode of the fourth transistor is coupled to the first node.

In an embodiment of the present disclosure, each of the shift register circuits further includes a first control circuit, a pull-up circuit, and a second control circuit. The first control circuit is configured to control a voltage of a pull-up node according to the voltage of the first node. The pull-up circuit is configured to provide a second voltage from a second voltage terminal to the first node, the shift signal output terminal, and the first drive signal output terminal according to the voltage of the pull-up node. The second control circuit is configured to control the voltage of the pull-up node according to the blanking control signal and the voltage of the first control node, and control the voltage of the pull-up node according to the display input signal.

In an embodiment of the present disclosure, the pull-up node may include a first pull-up node. The first control circuit may include a seventh transistor and an eighth transistor. A control electrode and a first electrode of the seventh transistor are coupled to a third voltage terminal, and a second electrode of the seventh transistor is coupled to the first pull-up node. A control electrode of the eighth transistor is coupled to the first node, a first electrode of the eighth transistor is coupled to the first pull-up node, and a second electrode of the eighth transistor is coupled to the second voltage terminal. The pull-up circuit may include a ninth transistor, a twentieth transistor, and a twenty-third transistor. A control electrode of the ninth transistor is coupled to the first pull-up node, a first electrode of the ninth transistor is coupled to the first node, and a second electrode of the ninth transistor is coupled to the second voltage terminal. A control electrode of the twentieth transistor is coupled to the first pull-up node, a first electrode of the twentieth transistor is coupled to the shift signal output terminal, and a second electrode of the twentieth transistor is coupled to the second voltage terminal. A control electrode of the twenty-third transistor is coupled to the first pull-up node, a first electrode of the twenty-third transistor is coupled to the first drive signal output terminal, and a second electrode of the twenty-third transistor is coupled to the second voltage terminal. The second control circuit may include a thirteenth transistor, a fourteenth transistor, and a fifteenth transistor. A control electrode of the thirteenth transistor is coupled to a first clock signal terminal to receive a first clock signal as the blanking control signal, and a first electrode of the thirteenth transistor is coupled to the first pull-up node. A control electrode of the fourteenth transistor is coupled to the first control node, a first electrode of the fourteenth transistor is coupled to a second electrode of the thirteenth transistor, and a second electrode of the fourteenth transistor is coupled to the second voltage terminal. A control electrode of the fifteenth transistor is coupled to a display input signal terminal to receive the display input signal, a first electrode of the fifteenth transistor is coupled to the first pull-up node, and a second electrode of the fifteenth transistor is coupled to the second voltage terminal.

In an embodiment of the present disclosure, the pull-up node may further include a second pull-up node. The first control circuit further includes a tenth transistor and an eleventh transistor. A control electrode and a first electrode of the tenth transistor are coupled to a fourth voltage terminal, and a second electrode of the tenth transistor is coupled to the second pull-up node. A control electrode of the eleventh transistor is coupled to the first node, a first electrode of the eleventh transistor is coupled to the second pull-up node, and a second electrode of the eleventh transistor is coupled to the second voltage terminal. The pull-up circuit may further include a twelfth transistor, a twenty-first transistor, and a twenty-fourth transistor. A control electrode of the twelfth transistor is coupled to the second pull-up node, a first electrode of the twelfth transistor is coupled to the first node, and a second electrode of the twelfth transistor is coupled to the second voltage terminal. A control electrode of the twenty-first transistor is coupled to the second pull-up node, a first electrode of the twenty-first transistor is coupled to the shift signal output terminal, and a second electrode of the twenty-first transistor is coupled to the second voltage terminal. A control electrode of the twenty-fourth transistor is coupled to the second pull-up node, a first electrode of the twenty-fourth transistor is coupled to the first drive signal output terminal, and a second electrode of the twenty-fourth transistor is coupled to the second voltage terminal. The second control circuit may further include a sixteenth transistor, a seventeenth transistor, and an eighteenth transistor. A control electrode of the sixteenth transistor is coupled to a first clock signal terminal to receive a first clock signal as the blanking control signal, and a first electrode of the sixteenth transistor is coupled to the second pull-up node. A control electrode of the seventeenth transistor is coupled to the first control node, a first electrode of the seventeenth transistor is coupled to a second electrode of the sixteenth transistor, and a second electrode of the seventeenth transistor is coupled to the second voltage terminal. A control electrode of the eighteenth transistor is coupled to a display input signal terminal to receive the display input signal, a first electrode of the eighteenth transistor is coupled to the second pull-up node, and a second electrode of the eighteenth transistor is coupled to the second voltage terminal.

In an embodiment of the present disclosure, each of the shift register circuit further includes a reset circuit. The reset circuit is configured to reset the first node according to a blanking reset signal from a blanking reset signal terminal, and reset the first node according to a display reset signal from a display reset signal terminal.

In an embodiment of the present disclosure, the reset circuit may include a fifth transistor and a sixth transistor. A control electrode of the fifth transistor is coupled to the blanking reset signal terminal, a first electrode of the fifth transistor is coupled to the first node, and a second electrode of the fifth transistor is coupled to the second voltage terminal. A control electrode of the sixth transistor is coupled to the display reset signal terminal, a first electrode of the sixth transistor is coupled to the first node, and a second electrode of the sixth transistor is coupled to the second voltage terminal.

In an embodiment of the present disclosure, the output circuit may further include a twenty-fifth transistor and a third capacitor. A control electrode of the twenty-fifth transistor is coupled to the first node, and a first electrode of the twenty-fifth transistor is coupled to a fifth clock signal terminal to receive a fifth clock signal, and a second electrode of the twenty-fifth transistor is coupled to a second drive signal output terminal. The third capacitor is coupled between the first node and the second drive signal output terminal.

In an embodiment of the present disclosure, the pull-up circuit may further include a twenty-sixth transistor and a twenty-seventh transistor. A control electrode of the twenty-sixth transistor is coupled to the first pull-up node, a first electrode of the twenty-sixth transistor is coupled to the second drive signal output terminal, and a second electrode of the twenty-sixth transistor is coupled to the second voltage terminal. A control electrode of the twenty-seventh transistor is coupled to the second pull-up node, a first electrode of the twenty-seventh transistor is coupled to the second drive signal output terminal, and a second electrode of the twenty-seventh transistor is coupled to the second voltage terminal.

In an embodiment of the present disclosure, the shift register includes one compensation selection circuit and one holding circuit.

A second aspect of the present disclosure provides a gate driving circuit. The gate driving circuit may include M shift registers and a first sub-clock signal line. A compensation selection control signal is provided to each of the shift registers via the first sub-clock signal line.

In an embodiment of the present disclosure, the gate driving circuit may further include a second sub-clock signal line and a blanking reset signal line. A shift signal from the shift register circuit at the $i^{th}$ stage is provided to the shift-register circuit at the $(i+2)^{th}$ stage as a display input signal. A first clock signal is provided to each of the shift register circuits via the second sub-clock signal line. A blanking reset signal is provided to each of the shift register circuits via the blanking reset signal line. A shift signal from the shift register circuit at the $(i+3)^{th}$ stage is provided to the shift register circuit at the $i^{th}$ stage as a display reset signal.

In an embodiment of the present disclosure, the gate driving circuit may further include a third sub-clock signal line, a fourth sub-clock signal line, a fifth sub-clock signal line, and a sixth sub-clock signal line. A fourth clock signal is provided to the shift register circuit at the $(4i-3)^{th}$ stage via the third sub-clock signal line. The fourth clock signal is provided to the shift register circuit at the $(4i-2)^{th}$ stage via the fourth sub-clock signal line. The fourth clock signal is provided to the shift register circuit at the $(4i-1)^{th}$ stage via the fifth sub-clock signal line. The fourth clock signal is provided to the shift register circuit at the $4i^{th}$ stage via the sixth sub-clock signal line.

In an embodiment of the present disclosure, the gate driving circuit may further include a seventh sub-clock signal line, an eighth sub-clock signal line, a ninth sub-clock signal line, and a tenth sub-clock signal line. A fifth clock signal is provided to the shift register circuit at the $(4i-3)^{th}$ stage via the seventh sub-clock signal line. The fifth clock signal is provided to the shift register circuit at the $(4i-2)^{th}$ stage via the eighth sub-clock signal line. The fifth clock signal is provided to the shift register circuit at the $(4i-1)^{th}$ stage via the ninth sub-clock signal line. The fifth clock signal is provided to the shift register circuit at the $4i^{th}$ stage via the tenth sub-clock signal line.

A third aspect of the present disclosure provides an array substrate. The array substrate includes a gate driving circuit according to the second aspect of the present disclosure.

A fourth aspect of the present disclosure provides a display device. The display device includes an array substrate according to the third aspect of the present disclosure.

A fifth aspect of the present disclosure provides a method for driving a shift register according to the first aspect of the present disclosure. In the method, a blanking input signal is provided according to a compensation selection control signal and a shift signal of N shift signals. The blanking input signal is maintained. A blanking pull-down signal is provided to a first node according to the blanking input signal and a blanking control signal. N shift signals are output via N shift signal output terminals and outputting N first drive signals are output via N first drive signal output terminals, respectively, according to a voltage of the first node.

BRIEF DESCRIPTION OF THE DRAWINGS

In order to illustrate the technical solutions of the present disclosure more clearly, the drawings of the embodiments will be briefly described below. It can be understood that the drawings described below are only related to some of the embodiments of the present disclosure, rather than limiting the present disclosure, in which:

FIGS. 4A-4E respectively show an exemplary circuit diagram of a blanking input circuit according to an embodiment of the present disclosure;

FIGS. 5A-5C respectively show an exemplary circuit diagram of a display input circuit according to an embodiment of the present disclosure;

DETAILED DESCRIPTION

Figure 1:
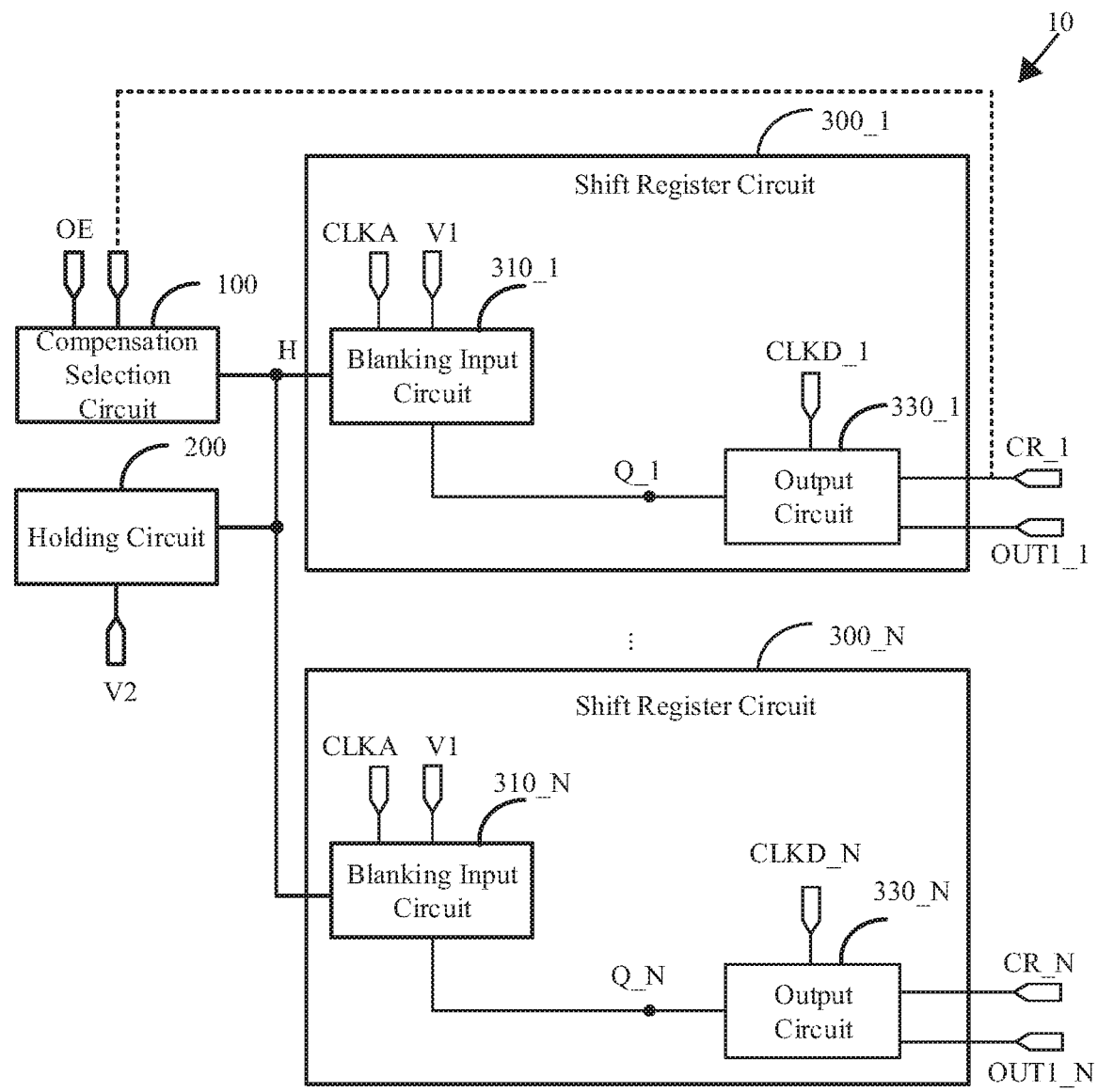
FIG. 1 shows a schematic block diagram of a shift register according to an embodiment of the present disclosure.

In order to make the technical solutions and advantages of the embodiments of the present disclosure clearer, the technical solutions of the embodiments of the present disclosure will be clearly and completely described below in conjunction with the accompanying drawings. Obviously, the described embodiments are merely part of the embodiments of the present disclosure, rather than all of the embodiments. According to the described embodiments, all the other embodiments obtained by those of ordinary skill in the art without creative labor also fall within the scope of protection of the present disclosure.

Unless otherwise stated, the technical or scientific terms used in the present disclosure shall have the ordinary meanings understood by those having ordinary skills in the art to which the present disclosure belongs. The terms "first", "second", and the like used in the present disclosure do not indicate any order, quantity, or importance, but are only used to distinguish different components. Similarly, "a", "an", or "the" and the like do not indicate a limit on quantity, but rather indicate that there is at least one. Words such as "including" or "comprising" mean that the element or item appearing before the word covers the element or item appearing after the word and the equivalent thereof, without excluding other elements or items. Words such as "connected" or "coupled" are not limited to physical or mechanical connections, but may include electrical connections, and may be direct connections or indirect connections through intermediate media. "Up", "down", "left", "right", or the like are only used to indicate the relative position relationship. In a case that the absolute position of the described object changes, the relative position relationship may also change accordingly.

When compensating a sub-pixel in an OLED display panel, in addition to an internal compensation performed by a pixel compensation circuit in the sub-pixel, an external compensation can also be performed by configuring a sensing transistor. When performing the external compensation, a gate driving circuit needs to provide a driving signal for the scanning transistor and a driving signal for the sensing transistor, respectively, to the sub-pixels in the display panel. As described above, in the gate driving circuit, a sensing circuit can provide a driving signal for the sensing transistor, and a scanning circuit can provide a driving signal for the scanning transistor, to cause the sub-pixel to display. For example, during a displaying phase (Display) of a frame, the driving signal for the scanning transistor can be provided, such that the sub-pixels displays. During a blanking phase (Blank) of a frame, the driving signal for the sensing transistor can be provided, such that the external compensation can be performed for the sub-pixels. During the blanking phase, the display panel does not display. In embodiments of the present disclosure, "one frame", "each frame" or "a frame" includes a displaying phase and a blanking phase that are performed sequentially.

In a method for external compensation, the driving signals for sensing from the gate driving circuit are sequentially scanned row by row. For example, the driving signals for the sub-pixels of the first row in the display panel are output during the blanking phase of the first frame. During the blanking stage of the second frame, the driving signals for the sub-pixels of the second row in the display panel are output. In such a way, the driving signals corresponding to each row of the sub-pixels are output sequentially in each frame. Therefore, the sequential row by row compensation of the display panel can be accomplished.

However, when the sequential row by row compensation method described above is adopted, there may be some display failure problems: a scanning line that moves sequentially during the scanning display of multiple frames, and a large difference in brightness in different areas of the display panel due to the difference of the timings for performing the external compensations. For example, when the external compensation is performed to the sub-pixels of the 100th row in the display panel, the sub-pixels of the 10th, 11th, and 12th rows of the display panel have already been externally compensated, but the luminous brightness of the sub-pixels of the 10th, 11th, and 12th rows may have changed at this time. For example, the luminous brightness of the sub-pixels of the 10th, 11th, and 12th rows may be reduced. Therefore, in this situation, uneven brightness may be caused in different areas of the display panel. This problem will be more obvious in large-sized display panels.

In view of the above problems, a random compensation for one or more rows of sub-pixels can be implemented with the shift register device provided by the embodiments of the present disclosure. Therefore, the display failure problems, such as scan lines and uneven display brightness due to sequential compensation, can be avoided. Moreover, the circuit configuration can be simplified.

Embodiments of the present disclosure provide a shift register and a driving method thereof, a gate driving circuit, an array substrate, and a display device. The embodiments of the present disclosure and examples thereof will be described in detail below with reference to the drawings.

FIG. 1 illustrates a schematic block diagram of a shift register according to an embodiment of the present disclosure. As shown in FIG. 1, the shift register 10 may include a compensation selection circuit 100, a holding circuit 200, and N shift register circuits (300_1, . . . , 300_N, hereinafter collectively referred to as 300). N is a natural number greater than 1.

In an embodiment of the present disclosure, the hold circuit 200 may hold a blanking input signal. For example, the holding circuit 200 may be coupled between a first control node H and a second voltage terminal V2. The holding circuit 200 can receive the blanking input signal via the first control node H, and hold the blanking input signal. In an embodiment, the second voltage terminal may provide a direct-current (DC) high-level signal, that is, a second voltage V2 from the second voltage terminal is at a high level.

Each of the shift register circuits 300 may include a blanking input circuit (310_1, . . . , 310 N, hereinafter collectively referred to as 310) and an output circuit (330_1, . . . , 330 N, hereinafter collectively referred to as 330).

The blanking input circuit 310 may provide a blanking pull-down signal to a first node (also referred to as a pull-down node) (Q_1, . . . , Q_N, hereinafter collectively referred to as Q) according to the blanking input signal and a blanking control signal, to control a voltage of the first node Q. For example, the blanking input circuit 310 may be coupled to the first control node H to receive the blanking input signal, coupled to a first clock signal terminal to receive a first clock signal CLKA as the blanking control signal, and coupled to a first voltage terminal to receive a first voltage V1 as the blanking pull-down signal. In an embodiment, the first voltage terminal may provide a DC low-level signal, that is, the first voltage V1 is at a low level.

The output circuit 330 may output a shift signal via a shift signal output terminal (CR_1, . . . , CR_N, hereinafter collectively referred to as CR), and output a first drive signal via a first drive signal output terminal (OUT1_1 . . . OUT1_N, hereinafter collectively referred to as OUT1), according to a voltage of the first node Q. For example, the output circuit 330 may be coupled to a fourth clock signal terminal to receive a fourth clock signal CLKD. The output circuit 330 may provide the fourth clock signal CLKD to the shift signal output terminal CR and the first drive signal output terminal OUT1, according to the voltage of the first node Q.

In an embodiment, in the displaying phase of the frame, the shift signal may be configured to control the shifting of the shift register circuits at an upper stage and a lower stage, while the first drive signal may be configured to drive a scanning transistor in the display panel, thereby driving the display panel to display. In the blanking phase of the frame, the first drive signal can be configured to drive a sensing transistor in a row of sub-pixels in the display panel to sense a driving current of the row of sub-pixels, thereby performing compensation based on the sensed driving current.

The compensation selection circuit 100 may provide, according to a compensation selection control signal OE from a compensation selection control signal terminal and the shift signal CR from one shift register circuit of the N shift register circuits 300, the blanking input signal to the holding circuit 200, and the N shift register circuits 300 via the first control node H.

In an embodiment, in the displaying phase of the frame, a timing sequence of the compensation selection control signal OE may be configured to be the same as a timing sequence of the shift signal CR provided to the compensation selection circuit 100. For example, as shown in FIG. 1, the shift signal CR_1 from the first shift register circuit 300_1 of the N shift register circuits 300 is provided to the compensation selection circuit 100. Moreover, in the displaying phase, the timing sequence of the compensation selection control signal OE is configured to be the same as the timing sequence of the shift signal CR_1.

In an embodiment, one compensation selection circuit 100 and one holding circuit 200 may provide the blanking pull-down signal to the N first nodes Q of the N shift register circuits, such that N driving signals are output via the N drive signal output terminals. Compared with the case where one compensation selection circuit 100 and one holding circuit 200 can only provide a blanking pull-down signal to one first node Q, the quantity of the compensation selection circuit 100 and the holding circuit 200 in the gate driving circuit can be saved, according to the embodiment of the present disclosure.

Figure 2:
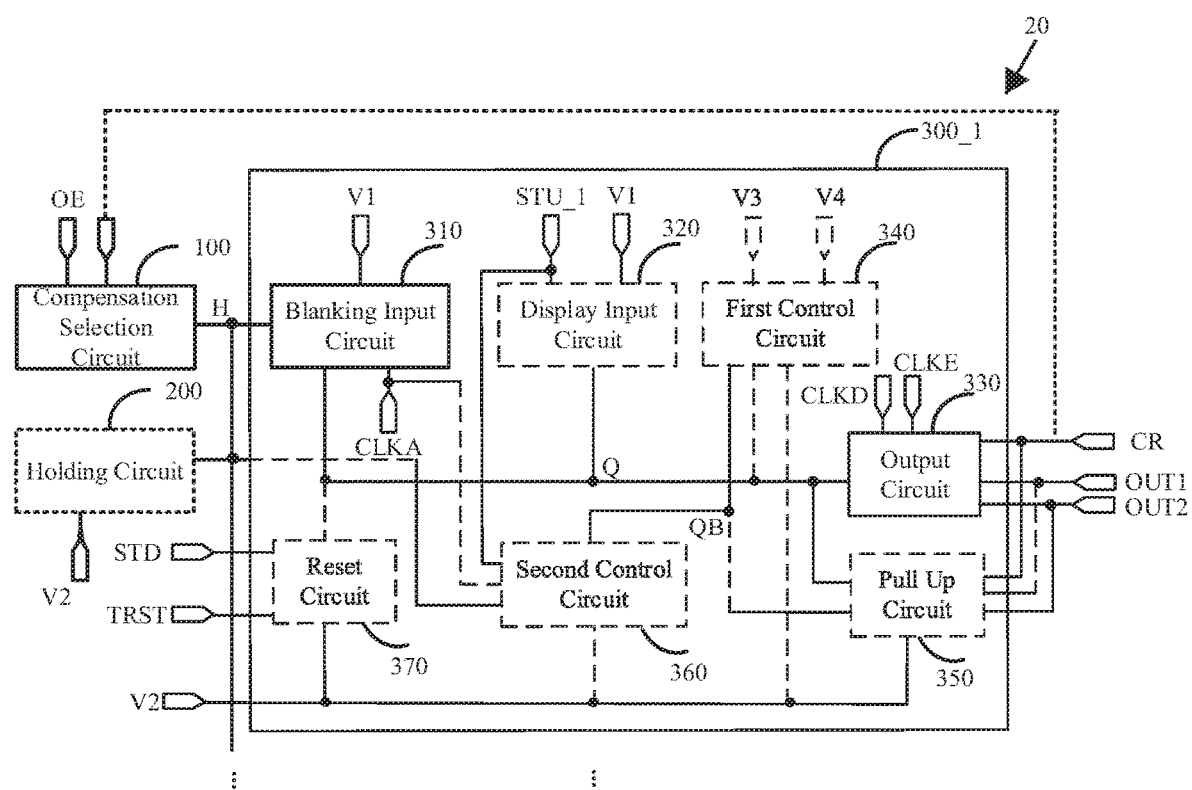
FIG. 2 shows a schematic block diagram of a shift register according to an embodiment of the present disclosure.

FIG. 2 shows a schematic block diagram of a shift register according to another embodiment of the present disclosure. As shown in FIG. 2, the shift register 20 may include a compensation selection circuit 100, a holding circuit 200, and N shift register circuits 300. The number of the shift register circuits 300 in the shift register 20 is two or more. For convenience of description, FIG. 2 only schematically illustrates one shift register circuit 300_1 of the shift register circuits. The structures of other shift register circuits (300_2 . . . 300_N) circuit can refer to the description of the shift register circuit 300_1.

As shown in FIG. 2, the shift register circuit 300_1 may include a blanking input circuit 310, a display input circuit 320, an output circuit 330, a first control circuit 340, a pull-up circuit 350, a second control circuit 360, and a reset circuit 370. The circuit structures of the compensation selection circuit 100, the holding circuit 200, and the blanking input circuit 310 are the same as the circuit structures of the compensation selection circuit 100, the holding circuit 200, and the blanking input circuit 310_1 in FIG. 1, which have been described above and will not be repeated here.

In an embodiment, the display input circuit 320 may provide a display pull-down signal to the first node Q according to a display input signal, to control a voltage of the first node Q. For example, the display input circuit 320 may be coupled to a display input signal terminal (STU_1, . . . , STU_N, hereinafter collectively referred to as STU), to receive the display input signal. Moreover, the display input circuit 320 may be coupled to a first voltage terminal to receive a first voltage V1 as the display pull-down signal.

In an embodiment, the output circuit 330 includes a second drive signal output terminal, in addition to the first drive signal output terminal. The output circuit 330 may also output a second drive signal via the second drive signal output terminal OUT2 according to the voltage of the first node Q. For example, the output circuit 330 may be coupled to a fifth clock signal terminal to receive a fifth clock signal CLKE. In an embodiment, the output circuit 330 may further provide the fifth clock signal CLKE to the second drive signal output terminal OUT2 according to the voltage of the first node Q. Furthermore, other structures and functions of the output circuit 510 may be the same as those of the output circuit 330_1 in FIG. 1, and details will not be described herein again. Those skilled in the art can understand that the number of drive signal output terminals is not limited to two, and may be more than two. The output circuit may output the respective drive signals according to the voltage of the first node Q and the respective clock signals.

The first control circuit 340 may control a voltage of a pull-up node QB according to the voltage of the first node Q. For example, the first control circuit 340 may be coupled to a second voltage terminal to receive a second voltage V2, and coupled to a third voltage terminal to receive a third voltage V3. In an embodiment, the second voltage terminal may provide a DC high-level signal, that is, the second voltage V2 is at a high level. The first control circuit 600 may control the voltage of the pull-up node QB according to the second voltage V2 and the third voltage V3, under the control of the voltage of the first node Q.

Further, the first control circuit 340 may be coupled to a fourth voltage terminal to receive a fourth voltage V4. The third voltage terminal and the fourth voltage terminal may alternately provide a DC low-level signal. For example, one of the third voltage V3 and the fourth voltage V4 is at a low level, and the other one is at a high level. In an embodiment, the first control circuit 340 may control the voltage of the pull-up node QB according to the second voltage V2 and the third voltage V3 (or the fourth voltage V4), under the control of the voltage of the first node Q.

The pull-up circuit 350 may provide the second voltage V2 from the second voltage terminal to the first node Q, the shift signal output terminal CR, the first drive signal output terminal OUT1, and the second drive signal output terminal OUT2, according to the voltage of the pull-up node QB. For example, the pull-up circuit 350 may be coupled to the second voltage terminal to receive the second voltage V2. Therefore, the pull-up circuit 350 can reduce the noise of the signals output from each terminal by pulling up the first node Q, the shift signal output terminal CR, and the respective drive signal output terminals.

The second control circuit 360 may control the voltage of the pull-up node QB according to the blanking control signal and the voltage of the first control node H. For example, the second control circuit 360 may be coupled to the first clock signal terminal to receive the first clock signal CLKA as a blanking control signal, and coupled to the second voltage terminal to receive the second voltage. In an embodiment, the second control circuit 360 may provide the second voltage to the pull-up node QB under the control of the first clock signal CLKA and the voltage of the first control node H. Moreover, the second control circuit 360 can also control the voltage of the pull-up node QB according to the display input signal STU. For example, the second control circuit 360 may be coupled to the display input signal terminal to receive a display input signal STU. In an embodiment, the second control circuit 360 may provide the second voltage to the pull-up node QB under the control of the display input signal STU. Therefore, the pull-up node QB can be pulled up by the second control circuit 360.

Moreover, the reset circuit 370 may reset the first node Q according to a blanking reset signal TRST from a blanking reset signal terminal, and reset the first node Q according to a display reset signal STD from a display reset signal terminal. For example, the reset circuit 370 may be coupled to the blanking reset signal terminal to receive the blanking reset signal TRST, coupled to the display reset signal terminal to receive the display reset signal STD, and coupled to the second voltage terminal to receive the second voltage V2. In an embodiment, the reset circuit 370 may provide the second voltage V2 to the first node Q according to the blanking reset signal TRST, and provide the second voltage V2 to the first node Q according to the display reset signal STD.

Those skilled in the art can understand that although FIG. 2 shows the shift register 20 includes the first control circuit 340, the pull-up circuit 350, the second control circuit 360, and the reset circuit 370, the above examples cannot limit the protection scope of the present disclosure. In implementations, a technician may choose to use or not use one or more of the above circuits according to actual situation. Various combinations and modifications based on the foregoing circuits are not deviated from the principles of the present disclosure. Details are not described herein again.

Figure 3:
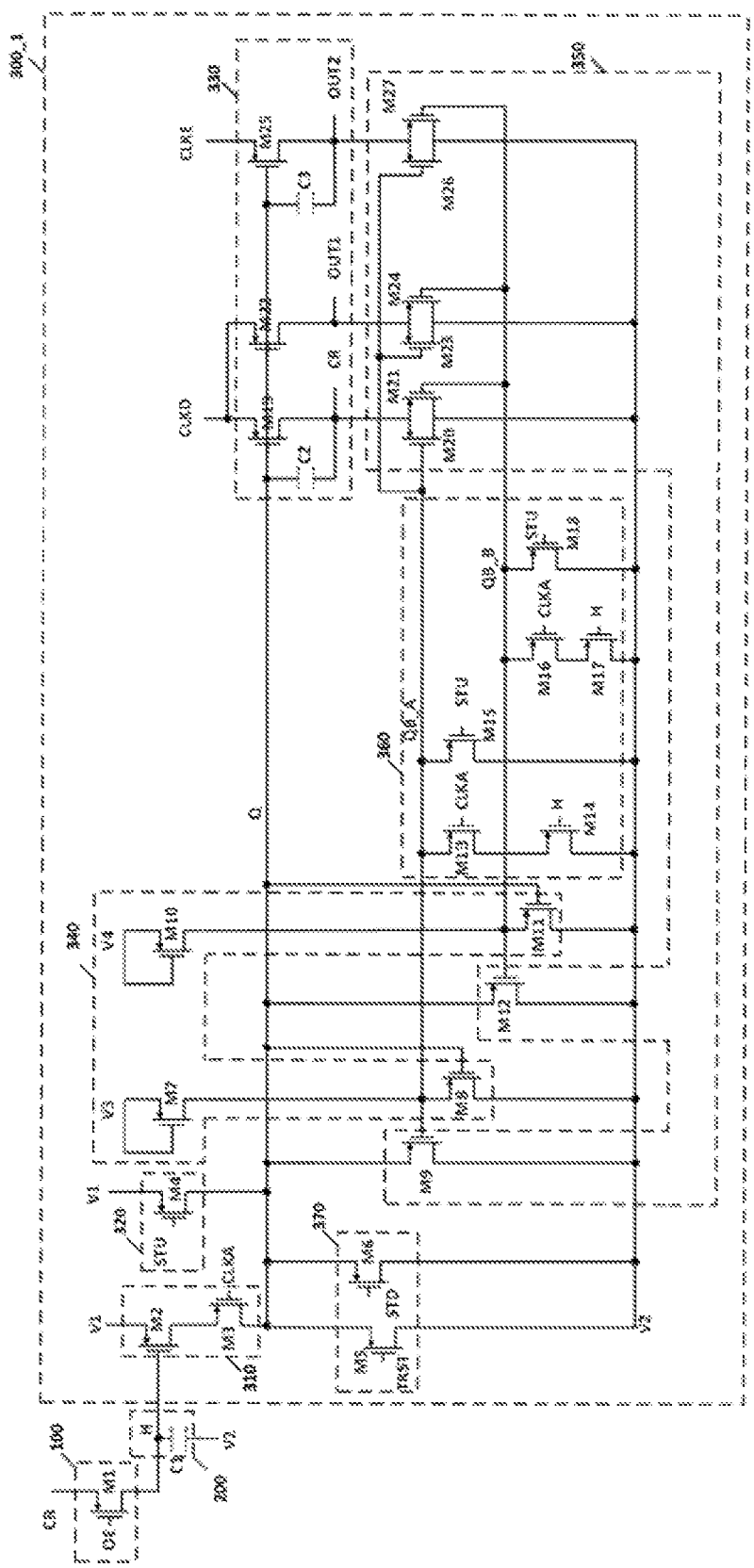
FIG. 3 illustrates an exemplary circuit diagram of a shift register according to an embodiment of the present disclosure.

The shift register according to the embodiments of the present disclosure are described with exemplary circuit structures below. FIG. 3 illustrates an exemplary circuit diagram of a shift register according to an embodiment of the present disclosure. The shift register is, for example, the shift register 20 shown in FIG. 2. For sake of brevity, the circuit structure of only one shift register circuit 300_1 is shown in FIG. 3. With regard to the circuit structures of other shift register circuits (300_2, . . . , 300_N), references can be made to the description of the shift register circuit 300_1. As shown in FIG. 3, the shift register may include a first transistor M1 to a twenty-seventh transistor M27, and a first capacitor C1 to a third capacitor C3.

It should be noted that the transistors used in the embodiments of the present disclosure may be thin film transistors or field effect transistors or other switching devices with like characteristics. In the embodiments of the present disclosure, the thin film transistor is taken as an example for description. A source and a drain of the transistor herein can be symmetrical in structure, thus there can be no difference in structure of the source and the drain of the transistor. In an embodiment of the present disclosure, in order to distinguish the two electrodes of the transistor other than a gate, one electrode can be referred to as a first electrode and the other electrode can be referred to as a second electrode. The gate of the transistor can be referred to as a control electrode. In addition, the transistors can be classified into N-type and P-type transistors according to the characteristics of the transistors. If the transistor is a P-type transistor, an ON voltage is a low-level voltage, for example, 0V, −5V, −10V, or other suitable voltage, and an OFF voltage is a high-level voltage, for example, 5V, 10V, or other suitable voltage. If the transistor is an N-type transistor, an ON voltage is a high-level voltage, for example, 5V, 10V, or other suitable voltage, and an OFF voltage is a low-level voltage, for example, 0V, −5V, −10V, or other suitable voltage.

In addition, it should be noted that, in the embodiments of the present disclosure, the transistors in the shift register are described as P-type transistors, as an example. Embodiments of the present disclosure include, but are not limited to, the above. At least part of the transistors in the shift register, for example, may also be N-type transistors.

In an embodiment of the present disclosure, the pull-up node QB may include at least one of a first pull-up node QB_A and a second pull-up node QB_B. FIG. 3 shows a case where the pull-up node QB includes both the first pull-up node QB_A and the second pull-up node QB_B. It can be understood that the pull-up node QB may also include only one of the first pull-up node QB_A and the second pull-up node QB_B, and the associated circuits may only be adjusted accordingly.

As shown in FIG. 3, the compensation selection circuit 100 includes a first transistor M1. A control electrode of the first transistor M1 is coupled to a compensation selection control signal terminal to receive the compensation selection control signal OE. A first electrode of the first transistor M1 is coupled to the shift signal output terminal CR_1 of the one shift register circuit 300_1 of the N shift register circuits. A second electrode of the first transistor M1 is coupled to the first control node H. In an embodiment, when the compensation selection control signal OE is at a low level, the first transistor M1 is turned on, such that the shift signal CR_1 can be provided to the first control node H, to provide the blanking input signal to the holding circuit 200 and the N shift register circuits 300.

The holding circuit 200 includes a first capacitor C1. A first end of the first capacitor is coupled to the first control node H. Another end of the first capacitor is coupled to the second voltage terminal to receive the second voltage V2.

The blanking input circuit 310 includes a second transistor M2 and a third transistor M3. A control electrode of the second transistor M2 is coupled to the first control node H. A first electrode of the second transistor M2 is coupled to the first voltage terminal to receive the first voltage V1 as the blanking pull-down signal. A second electrode of the second transistor M2 is coupled to a first electrode of the third transistor M3. A control electrode of the third transistor M3 is coupled to the first clock signal terminal to receive the first clock signal CLKA as the blanking control signal. The first electrode of the third transistor M3 is coupled to the second electrode of the second transistor M2. A second electrode of the transistor M3 is coupled to the first node Q. In an embodiment, when the voltage of the first control node H and the first clock signal CLKA are both at low level, the second transistor M2 and the third transistor M3 are turned on, to provide the first voltage V1 to the first node Q, such that the first node Q is pulled down to low.

The display input circuit 320 includes a fourth transistor M4. A control electrode of the fourth transistor M4 is coupled to the display input signal terminal to receive the display input signal STU. A first electrode of the fourth transistor M4 is coupled to the first voltage terminal to receive the first voltage V1 as the display pull-down signal. A second electrode of the fourth transistor M4 is coupled to the first node Q. In an embodiment, when the display input signal STU is at a low level, the fourth transistor M4 is turned on, to provide the first voltage V1 to the first node Q, such that the voltage of the first node Q is at a low level.

The output circuit 330 includes a nineteenth transistor M19, a twenty-second transistor M22, a twenty-fifth transistor M25, a second capacitor C2, and a third capacitor C3. A control electrode of the nineteenth transistor M19 is coupled to the first node Q. A first electrode of the nineteenth transistor M19 is coupled to the fourth clock signal terminal to receive the fourth clock signal CLKD. A second electrode of the nineteenth transistor M19 is coupled to the shift signal output terminal CR. A control electrode of the twenty-second transistor M22 is coupled to the first node Q. A first electrode of the twenty-second transistor M22 is coupled to the fourth clock signal terminal to receive the fourth clock signal CLKD. A second electrode of the twenty-second transistor M22 is coupled to the first drive signal output terminal OUT1. A control electrode of the twenty-fifth transistor M25 is coupled to the first node Q. A first electrode of the twenty-fifth transistor M25 is coupled to the fifth clock signal terminal to receive the fifth clock signal CLKE. A second electrode of the twenty-fifth transistor M25 is coupled to the second drive signal output terminal OUT2. A first end of the second capacitor C2 is coupled to the first node Q, and a second end of the second capacitor C2 is coupled to the shift signal output terminal CR. A first end of the third capacitor C3 is coupled to the first node Q, and a second end of the third capacitor C3 is coupled to the second drive signal output terminal OUT2.

In an embodiment, when the voltage of the first node Q is at a low level, the nineteenth transistor M19, the twenty-second transistor M22, and the twenty-fifth transistor M25 are turned on, to provide the fourth clock signal CLKD to the shift signal output terminal CR and the first drive signal output terminal OUT1, and provide the fifth clock signal CLKE to the second drive signal output terminal OUT2.

The first control circuit 340 includes a seventh transistor M7, an eighth transistor M8, a tenth transistor M10, and an eleventh transistor M11. A control electrode and a first electrode of the seventh transistor M7 are coupled to the third voltage terminal to receive the third voltage V3. A second electrode of the seventh transistor M7 is coupled to the first pull-up node QB_A. A control electrode of the eighth transistor M8 is coupled to the first node Q. A first electrode of the eighth transistor M8 is coupled to the first pull-up node QB_A. A second electrode of the eighth transistor M8 is coupled to the second voltage terminal to receive the second voltage V2. A control electrode and a first electrode of the tenth transistor M10 are coupled to the fourth voltage terminal to receive the fourth voltage V4. A second electrode of the tenth transistor M10 is coupled to the second pull-up node QB_B. A control electrode of the eleventh transistor M11 is coupled to the first node Q. A first electrode of the eleventh transistor M11 is coupled to the second pull-up node QB_B. A second electrode of the eleventh transistor M11 is coupled to the second voltage terminal V2 to receive the second voltage V2.

It can be understood, in a case that the pull-up node QB includes only the first pull-up node QB_A (or the second pull-up node QB_B), the first control circuit 600 may include a seventh transistor M7 and an eighth transistor M8 (or a tenth transistor M10 and eleventh transistor M11). In this situation, the specific circuit structure is similar and will not be repeated here.

In an embodiment, the third voltage terminal V3 and the fourth voltage terminal V4 may be configured to alternately provide a low level voltage. That is, when the third voltage terminal V3 provides a high level voltage, the fourth voltage terminal V4 provides a low level voltage, and the tenth transistor M10 is turned on. When the third voltage terminal V3 provides a low level voltage, the fourth voltage terminal V4 provides a high level voltage, and the seventh transistor M7 is turned on. Therefore, only one of the seventh transistor M7 and the tenth transistor M10 is in an ON state. This can avoid performance drift caused by long-term conduction of transistor.

When the seventh transistor M7 is turned on, the first pull-up node QB_A can be charged via the third voltage V3. When the tenth transistor M10 is turned on, the second pull-up node QB_B can be charged via the fourth voltage V4. When the voltage of the first node Q is at a low level, the eighth transistor M8 and the eleventh transistor M11 are turned on. For example, with regard to the design of the transistors, the seventh transistor M7 and the eighth transistor M8 may be configured (for example, by setting the size ratio of the two transistors, the threshold voltages, etc.), such that when both the seventh transistor M7 and the eighth transistor M8 are turned on, the first pull-up node QB_A can be pulled to a high level via the second voltage V2, which can cause the twentieth transistor M20, the twenty-third transistor M23, and the twenty-sixth transistor M26 being turned off. On the other hand, the tenth transistor M10 and the eleventh transistor M11 may be configured (for example, by setting the size ratio of the two transistors, the threshold voltages, etc.), such that when both the tenth transistor M10 and the eleventh transistor M11 are turned on, the voltage of the second pull-up node QB_B may be pulled up to a high level via the second voltage V2, which can cause the twenty-first transistor M21, the twenty-fourth transistor M24, and the twenty-seventh transistor M27 being turned off.

As shown in FIG. 3, the pull-up circuit 350 includes a ninth transistor M9, a twentieth transistor M20, a twenty-third transistor M23, a twelfth transistor M12, a twenty-first transistor M21, a twenty-fourth transistor M24, a twenty-sixth transistor M26, and a twenty-seventh transistor M27.

A control electrode of the ninth transistor M9 is coupled to the first pull-up node QB_A, a first electrode of the ninth transistor M9 is coupled to the first node Q, and a second electrode of the ninth transistor M9 is coupled to the second voltage terminal V2 to receive the second voltage V2. A control electrode of the twentieth transistor M20 is coupled to the first pull-up node QB_A, a first electrode of the twentieth transistor M20 is coupled to the shift signal output terminal CR, and a second electrode of the twentieth transistor M20 is coupled to the second voltage terminal V2. A control electrode of the twenty-third transistor M23 is coupled to the first pull-up node QB_A, a first electrode of the twenty-third transistor M23 is coupled to the first drive signal output terminal OUT1, and a second electrode of the twenty-third transistor M23 is coupled to the second voltage terminal V2 to receive the second voltage V2. A control electrode of the twenty-sixth transistor M26 is coupled to the first pull-up node QB_A, a first electrode of the twenty-sixth transistor is coupled to the second drive signal output terminal OUT2, and a second electrode of the twenty-sixth transistor M26 is coupled to the second voltage terminal V2 to receive the second voltage V2. In an embodiment, when the voltage of the first pull-up node QB_A is at a low level, the ninth transistor M9, the twentieth transistor M20, the twenty-third transistor M23, and the twenty-sixth transistor are turned on, such that the first node Q, the shift signal output terminal CR, the first drive signal output terminal OUT1, and the second drive signal output terminal OUT2 are pulled up.

A control electrode of the twelfth transistor M12 is coupled to the second pull-up node QB_B, a first electrode of the twelfth transistor M12 is coupled to the first node Q, and a second electrode of the twelfth transistor M12 is coupled to the second voltage terminal V2. A control electrode of the twenty-first transistor M21 is coupled to the second pull-up node QB_B, a first electrode of the twenty-first transistor M21 is coupled to the shift signal output terminal CR, and a second electrode of the twenty-first transistor M21 is coupled to the second voltage terminal V2. A control electrode of the twenty-fourth transistor M24 is coupled to the second pull-up node QB_B, a first electrode of the twenty-fourth transistor M24 is coupled to the first drive signal output terminal OUT1, and a second electrode of the twenty-fourth transistor M24 is coupled to the second voltage terminal V2. A control electrode of the twenty-seventh transistor M27 is coupled to the second pull-up node QB_B, a first electrode of the twenty-seventh transistor is coupled to the second drive signal output terminal OUT2, and a second electrode of the twenty-seventh transistor M27 is coupled to the second voltage terminals V2. In an embodiment, when the voltage of the second pull-up node QB_B is at a low level, the twelfth transistor M12, the twenty-first transistor M21, the twenty-fourth transistor M24, and the twenty-seventh transistor M27 are turned on, such that the first node Q, the shift signal output terminal CR, the first drive signal output terminal OUT1, and the second drive signal output terminal OUT2 are pulled up.

It can be understood that when the pull-up node QB only includes the first pull-up node QB_A (or the second pull-up node QB_B), the pull-up circuit 700 may include the ninth transistor M9, the twentieth transistor M20, the twenty-third transistor M23, and the twenty-sixth transistor (or, the twelfth transistor M12, the twenty-first transistor M21, the twenty-fourth transistor M24, and the twenty-seventh transistor M27). The specific circuit structure is the same and will not be repeated here.

As shown in FIG. 3, the second control circuit 360 may include a thirteenth transistor M13, a fourteenth transistor M14, a fifteenth transistor M15, a sixteenth transistor M16, a seventeenth transistor M17, and an eighteenth transistor M18.

A control electrode of the thirteenth transistor M13 is coupled to the first clock signal terminal to receive the first clock signal CLKA as the blanking control signal, and a first electrode of the thirteenth transistor M13 is coupled to the first pull-up node QB_A. A control electrode of the fourteenth transistor M14 is coupled to the first control node H, a first electrode of the fourteenth transistor M14 is coupled to a second electrode of the thirteenth transistor M13, and a second electrode of the fourteenth transistor M14 is coupled to the second voltage terminals V2. A control electrode of the fifteenth transistor M15 is coupled to the display input signal terminal to receive the display input signal STU. A first electrode of the fifteenth transistor M15 is coupled to the first pull-up node QB_A, and a second electrode of the fifteenth transistor M15 is coupled to the second voltage terminal to receive the second voltage V2. In an embodiment, when the voltages of the first clock signal CLKA and the first control node H are both at a low level, the second voltage can be provided to the first pull-up node QB_A. In addition, when the display input signal STU is at a low level, the second voltage can be provided to the first pull-up node QB_A.

A control electrode of the sixteenth transistor M16 is coupled to the first clock signal terminal to receive the first clock signal CLKA as the blanking control signal, and a first electrode of the sixteenth transistor M16 is coupled to the second pull-up node QB_B. A control electrode of the seventeenth transistor M17 is coupled to the first control node H, a first electrode of the seventeenth transistor M17 is coupled to a second electrode of the sixteenth transistor M16, and a second electrode of the seventeenth transistor M17 is coupled to the second voltage terminal to receive the second voltage V2. A control electrode of the eighteenth transistor M18 is coupled to the display input signal terminal to receive the display input signal STU. A first electrode of the eighteenth transistor M18 is coupled to the second pull-up node QB_B, and a second electrode of the eighteenth transistor M18 is coupled to the second voltage terminal to receive the second voltage V2. In an embodiment, when the voltages of the first clock signal CLKA and the first control node H are both at a low level, a second voltage can be provided to the second pull-up node QB_B. In addition, when the display input signal STU is at a low level, the second voltage can be provided to the second pull-up node QB_B.

It can be understood that when the pull-up node QB only includes the first pull-up node QB_A (or the second pull-up node QB_B), the pull-up circuit 700 may include the thirteenth transistor M13, the fourteenth transistor M14, and the fifteenth transistor M15 (or, the sixteenth transistor M16, the seventeenth transistor M17, and the eighteenth transistor M18). The specific circuit structure is the same and will not be repeated here.

Moreover, as shown in FIG. 3, the reset circuit 370 may include a fifth transistor M5 and a sixth transistor M6. A control electrode of the fifth transistor M5 is coupled to the blanking reset signal terminal to receive the blanking reset signal TRST, a first electrode of the fifth transistor M5 is coupled to the first node Q, and a second electrode of the fifth transistor M5 is coupled to the second voltage terminal to receive the second voltage V2. In an embodiment, when the blanking reset signal TRST is at a low level, the fifth transistor M5 is turned on, to provide the second voltage V2 to the first node Q. A control electrode of the sixth transistor M6 is coupled to the display reset signal terminal to receive the display reset signal STD. A first electrode of the sixth transistor M6 is coupled to the first node Q. A second electrode of the sixth transistor M6 is coupled to the second voltage terminal V2. In an embodiment, when the display reset signal STD is at a low level, the sixth transistor M6 is turned on, to provide the second voltage V2 to the first node Q.

It can be understood that the respective circuits in the shift register according to the embodiment of the present disclosure is not limited to the above circuit structures. Some circuit modifications can be described schematically below with reference to the accompanying drawings. The modifications are also non-limited.

FIGS. 4A-4E respectively show exemplary circuit diagrams of the blanking input circuit 310 according to various embodiments of the present disclosure.

As shown in FIGS. 4A and 4B, the blanking input circuit 310 is different from the blanking input circuit 310 in FIG. 3 in that the first electrode of the second transistor is coupled to a different clock signal terminal to receive the corresponding clock signal as the blanking pull-down signal. For example, the different clock signal terminal to be coupled may be the third clock signal terminal CLKC or the first clock signal terminal CLKA. In other words, the blanking pull-down signal does not need to be maintained at a low level all the time, it only needs to be at a low level during the period when the blanking control signal CLKA is at a low level.

As shown in FIG. 4C, the blanking input circuit 310 is different from the blanking input circuit 310 in FIG. 4A in that it further includes a blanking input transistor M3_a. A control electrode of the blanking input transistor M3_a is coupled to the second electrode of the second transistor and the first electrode of the third transistor. A first electrode of the blanking input transistor M3_a is coupled to the first voltage terminal V1. A second electrode of the blanking input transistor M3_a is coupled to the first node Q.

As shown in FIG. 4D, the blanking input circuit 310 is different from the blanking input circuit 310 in FIG. 4C in that the third transistor is replaced with a transistor M3_b and a transistor M3_c. A control electrode of the transistor M3_b is coupled to the first pull-up node QB_A, and a control electrode of the transistor M3_c is coupled to the second pull-up node QB_B. A first electrode of the transistor M3_b and a first electrode of the transistor M3_c are coupled to the second electrode of the second transistor. A second electrode of the transistor M3_b and a second electrode of the transistor M3_c are coupled to the second voltage terminal.

As shown in FIG. 4E, the blanking input circuit 310 is different from the blanking input circuit 310 in FIG. 4C in that the third transistor is replaced with a transistor M3_b, a transistor M3_c, and a transistor M3_d. A control electrode of the transistor M3_b is coupled to the first control node H. A first electrode of the transistor M3_b is coupled to a second electrode of the transistor M3_d. A second electrode of the transistor M3_b is coupled to the second voltage terminal. A control electrode of the transistor M3_c is coupled to the first electrode of the transistor M3_b. A first electrode of the transistor M3_c is coupled to the second electrode of the second transistor M2. A second electrode of the transistor M3_c is coupled to the second voltage terminal V2. A control electrode and a first electrode of the transistor M3_d are coupled to the third clock signal terminal CLKC.

FIGS. 5A-5C respectively show exemplary circuit diagrams of the display input circuit 320 according to various embodiments of the present disclosure.

As shown in FIG. 5A, the display input circuit 320 may include a fourth transistor M4 and a fourth leakage-preventive transistor M4_b. A control electrode and a first electrode of the fourth transistor M4 and a control electrode of the fourth leakage-preventive transistor M4_b are coupled to the display input signal terminal to receive the display input signal STU, as the display pull-down signal. A second electrode of the fourth transistor M4 is coupled to a first electrode of the fourth leakage-preventive transistor M4_b. A second electrode of the fourth leakage-proof transistor M4_b is coupled to the first node Q.

As shown in FIG. 5B, the display input circuit 320 may include a fourth transistor M4 and a fourth leakage-preventive transistor M4_b. A control electrode of the fourth transistor M4 is coupled to the display input signal terminal to receive the display input signal STU. A first electrode of the fourth transistor M4 is coupled to the first voltage terminal to receive the first voltage V1, as the display pull-down signal. A control electrode and a first electrode of the fourth leakage preventive transistor M4_b are coupled to a second electrode of the fourth transistor M4, and a second electrode of the fourth transistor M4_b is coupled to the first node Q.

As shown in FIG. 5C, the display input circuit 320 may include a fourth transistor M4. A control electrode and a first electrode of the fourth transistor are coupled to the display input signal terminal to receive the display input signal STU, as the display pull-down signal. A second electrode of the fourth transistor is coupled to the first node Q.

Figure 6A:
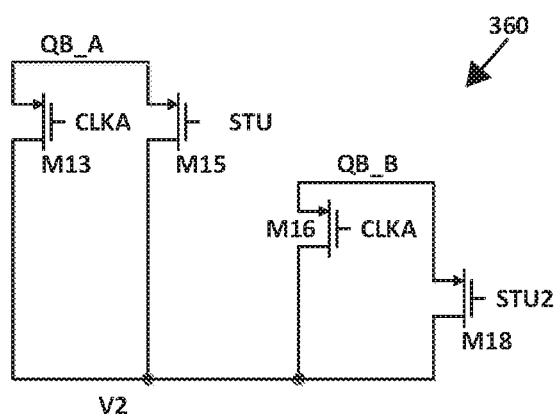
FIGS. 6A and 6B respectively show an exemplary circuit diagram of a second control circuit according to an embodiment of the present disclosure.
Figure 6B:
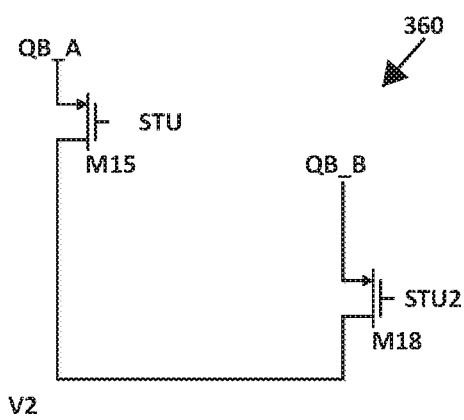

FIGS. 6A and 6B respectively show exemplary circuit diagrams of the second control circuit 360 according to various embodiments of the present disclosure.

As shown in FIG. 6A, the second control circuit 360 includes a thirteenth transistor M13, a fifteenth transistor M15, a sixteenth transistor M16, and an eighteenth transistor M18. A control electrode of the thirteenth transistor M13 is coupled to the first clock signal terminal CLKA to receive the first clock signal as the blanking control signal. A first electrode of the thirteenth transistor M13 is coupled to the first pull-up node QB_A. A second electrode of the thirteenth transistor M13 is coupled to the second voltage terminal V2. A control electrode of the fifteenth transistor M15 is coupled to the display input signal terminal STU. A first electrode of the fifteenth transistor M15 is coupled to the first pull-up node QB_A. A second electrode of the fifteenth transistor M15 is coupled to the second voltage terminal V2. A control electrode of the sixteenth transistor M16 is coupled to the first clock signal terminal CLKA to receive the first clock signal as the blanking control signal. A first electrode of the sixteenth transistor M16 is coupled to the second pull-up node QB_B. A second electrode of the sixteenth transistor M16 is coupled to the second voltage terminal V2. A control electrode of the eighteenth transistor M18 is coupled to the display input signal terminal. A first electrode of the eighteenth transistor M18 is coupled to the second pull-up node QB_B. A second electrode of the eighteenth transistor M18 is coupled to the second voltage terminal V2. Compared with the second control circuit 360 of the shift register 20 in FIG. 3, the second control circuit 360 in FIG. 6A does not include the fourteenth transistor M14 and the seventeenth transistor M17.

As shown in FIG. 6B, the second control circuit 360 includes a fifteenth transistor M15 and an eighteenth transistor M18. A control electrode of the fifteenth transistor M15 is coupled to the display input signal terminal STU, a first electrode of the fifteenth transistor M15 is coupled to the first pull-up node QB_A, and a second electrode of the fifteenth transistor M15 is coupled to the second voltage terminal V2. A control electrode of the eighteenth transistor M18 is coupled to the display input signal terminal, a first electrode of the eighteenth transistor M18 is coupled to the second pull-up node QB_B, and a second electrode of the eighteenth transistor M18 is coupled to the second voltage terminal V2. Compared with the second control circuit 360 of the shift register 20 in FIG. 3, the second control circuit 360 in FIG. 6B does not include the thirteenth transistor M13, the fourteenth transistor M14, the sixteenth transistor M16, and the seventeenth transistor M17.

Figure 7:
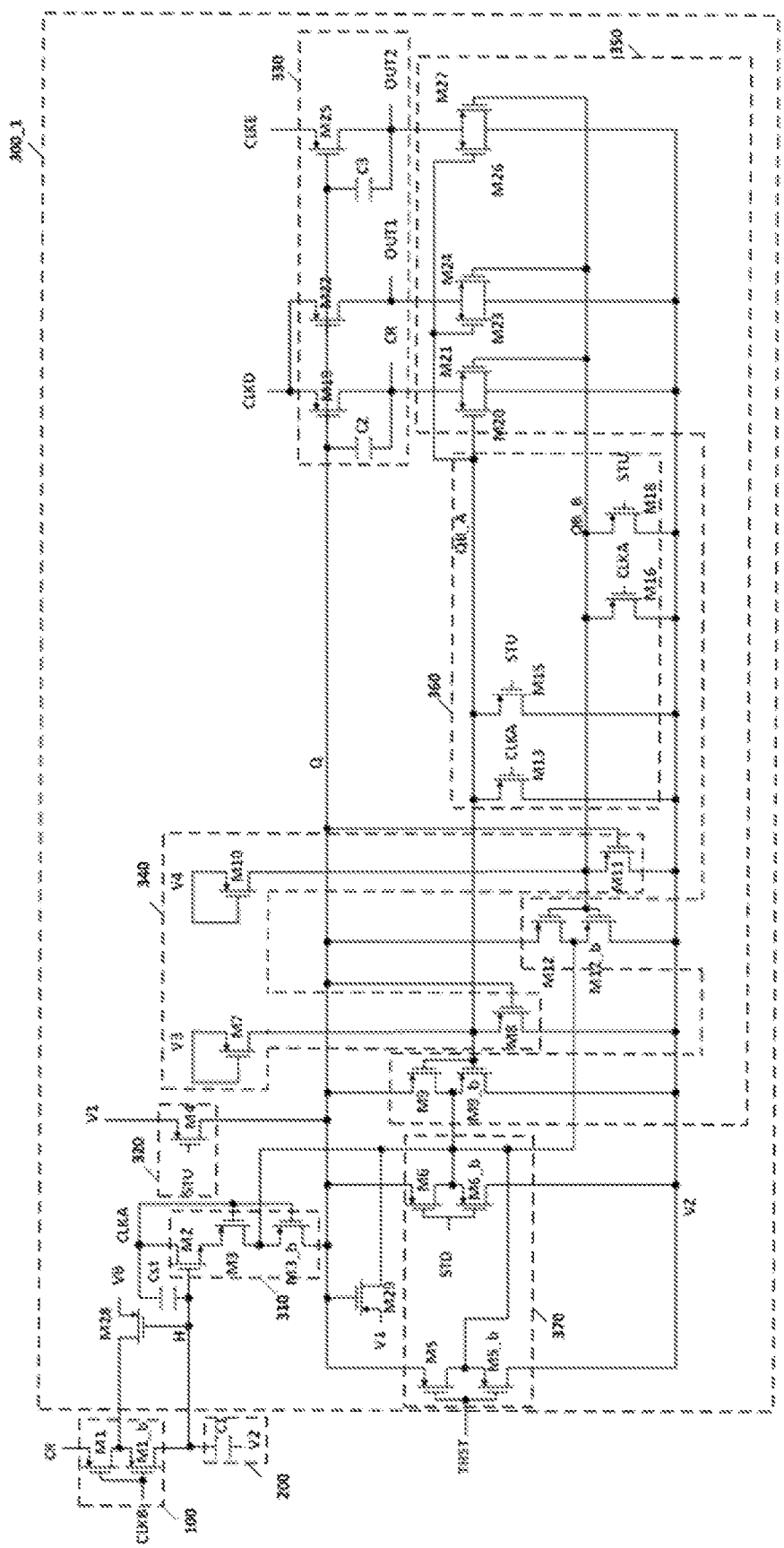
FIG. 7 shows an exemplary circuit diagram of a shift register according to another embodiment of the present disclosure.

FIG. 7 illustrates an exemplary circuit diagram of a shift register according to another embodiment of the present disclosure. As shown in FIG. 7, the shift register is different from the shift register in FIG. 3 in that, the second control circuit 360 includes a thirteenth transistor M13, a fifteenth transistor M15, a sixteenth transistor M16, and an eighteenth transistor M18. References can be made to the description of the second control circuit 360 in FIG. 6A. Moreover, the shift register also includes a first leakage-preventive transistor M1_b, a third leakage-preventive transistor M3_b, a fifth leakage-preventive transistor M5_b, a sixth leakage-preventive transistor M6_b, a ninth leakage-preventive transistor M9_b, and a twelfth leakage-preventive transistor M12_b, a twenty-eighth transistor M28, and a twenty-ninth transistor M29. The working principle of leakage-prevention will be described below using the first leakage-preventive transistor M1_b as an example.

A control electrode of the first leakage-preventive transistor M1_b is coupled to the second clock signal terminal CLKB, a first electrode of the first leakage-preventive transistor M1_b is coupled to a second electrode of the twenty-eighth transistor M28, and a second electrode of the first leakage-preventive transistor M1_b is coupled to the first control node H. A control electrode of the twenty-eighth transistor M28 is coupled to the first control node H, and a first electrode of the twenty-eighth transistor M28 is coupled to the second voltage terminal V2 to receive a low-level second voltage. When the first control node H is at a low level, the twenty-eighth transistor M28 is turned on under the control of the voltage level of the first control node H, to provide a low-level signal from the second voltage terminal V2 to the first electrode of the leakage-preventive transistor M1_b, such that both the first electrode and the second electrode of the first leakage-preventive transistor M1_b are at a low-level state. Therefore, the charge at the first control node H is prevented from leaking through the first leakage-preventive transistor M1_b. As the control electrode of the first leakage-preventive transistor M1_b and the control electrode of the first transistor M1 are coupled, the combination of the first transistor M1 and the first leakage-preventive M1_b can not only achieve the same effect as the aforementioned first transistor M1, but also prevent charge leakage.

Similarly, the third leakage-preventive transistor M3_b, the fifth leakage-preventive transistor M5_b, the sixth leakage-preventive transistor M6_b, the ninth leakage-preventive transistor M9_b, and the twelfth leakage-preventive transistor M12_b can be combined with the twenty-ninth transistor M29, respectively, to achieve leakage prevention structure. Therefore, the leakage of charge at the first node Q can be prevented. The working principle of preventing the leakage of the first node Q is similar with the working principle of preventing the leakage of the first control node H described above, and will not be repeated here.

Figure 8:
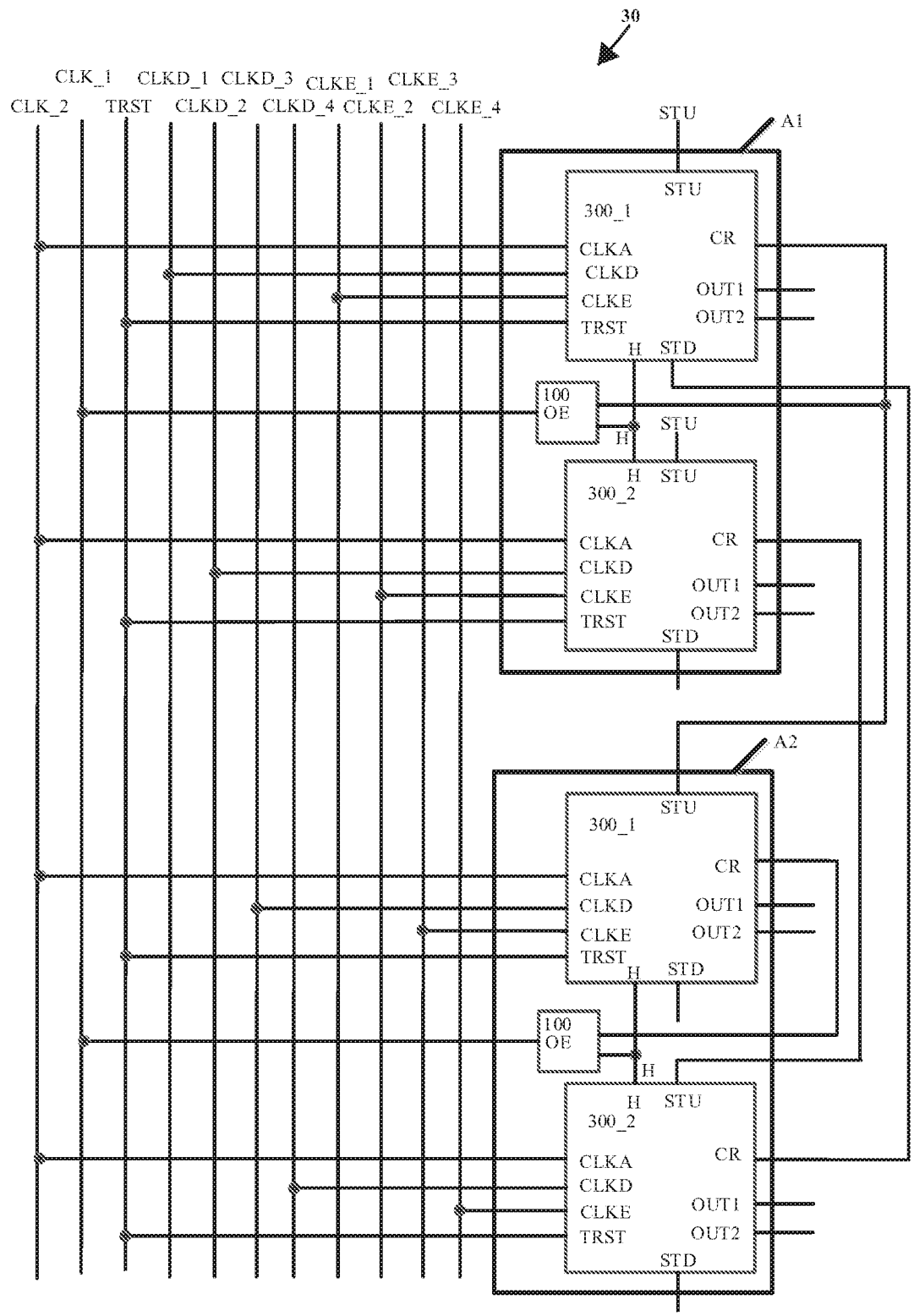
FIG. 8 shows a schematic diagram of a gate driving circuit according to an embodiment of the present disclosure.

Embodiments of the present disclosure also provide a gate driving circuit including a shift register. As shown in FIG. 8, the gate driving circuit 30 may include M shift registers, where M is an integer greater than 1. Any one or more of the shift registers may adopt the structure of the shift register 10 or the shift register 20 according to the embodiments of the present disclosure or a modification thereof. It can be understood that the gate driving circuit 30 has M×N shift register circuits. FIG. 8 only schematically shows the first two shift registers (A1, A2). Each shift register includes, for example, two shift register circuits (i.e., N=2). As shown in FIG. 8, the first shift register A1 includes a compensation selection circuit 100, a holding circuit 200 (not shown), a shift register circuit 300_1 (hereinafter referred to as a first shift register circuit SC1), and a shift register circuit 300_2 (hereinafter referred to as a second shift register circuit SC2). The second shift register A2 includes a compensation selection circuit 100, a holding circuit 200 (not shown), a shift register circuit 300_1 (hereinafter referred to as a third shift register circuit SC3), and a shift register circuit 300_2 (hereinafter referred to as a fourth shift register circuit SC4). Moreover, the structures and connection relationships of the third shift register A3 (including a fifth shift register circuit SC5 and a sixth shift register circuit SC6) to the M-th shift register are similar with the above. Thus, illustrations thereof can be omitted here.

As shown in FIG. 8, a display input signal terminal STU of the first shift register circuit SC1 and a display input signal terminal STU of the second shift register circuit SC2 receive, respectively, an input signal STU. Moreover, a shift signal CR from the $i^{th}$ shift register circuit is provided to the $(i+2)^{th}$ shift register circuit as the display input signal STU. For example, a shift signal CR of the first shift register circuit SC1 is configured as a display input signal STU of the third shift register circuit SC3. A shift signal CR of the second shift register circuit SC2 is configured as a display input signal STU of the fourth shift register circuit SC4.

The gate driving circuit 30 further includes a first sub-clock signal line CLK_1 and a second sub-clock signal line CLK_2. The first sub-clock signal line CLK_1 provides a compensation selection control signal OE to each of the compensation selection circuits 100. The second sub-clock signal line CLK_2 provides a first clock signal CLKA to each of the shift register circuits.

The compensation selection circuit 100 in each shift register receives the shift signal CR from a first one of the shift register circuits in such shift register, and then provides a blanking input signal to the first control node H according to the compensation selection control signal OE and the shift signal CR. For example, the compensation selection circuit 100 in the first shift register A1 is coupled to the shift signal output terminal of the first shift register circuit SC1. The compensation selection circuit 100 in the second shift register A2 is coupled to the shift signal output terminal of the third shift register circuit SC3. The compensation selection circuit 100 in the third shift register A3 is coupled to the shift signal output terminal of the fifth shift register circuit SC5 (not shown).

Furthermore, the shift signal CR from the shift register circuit at the $(i+3)^{th}$ stage is provided to the shift register circuit at the $i^{th}$ stage as a display reset signal STD. For example, the shift signal CR of the fourth shift register circuit SC4 is configured as the display reset signal STD of the first shift register circuit SC1.

The gate driving circuit 30 further includes a blanking reset signal line TRST. The blanking reset signal line TRST provides a blanking reset signal TRST to each of the shift register circuits.

As shown in FIG. 8, the gate driving circuit 30 may further include a third sub-clock signal line CLKD_1, a fourth sub-clock signal line CLKD_2, a fifth sub-clock signal line CLKD_3, and a sixth sub-clock signal line CLKD_4. In an embodiment, the third sub-clock signal line CLKD_1 provides a fourth clock signal to the shift register circuit at the $(4i-3)^{th}$ stage. The fourth sub-clock signal line CLKD_2 provides a fourth clock signal to the shift register circuit at the $(4i-2)^{th}$ stage. The fifth sub-clock signal line CLKD_3 provides a fourth clock signal to the shift register circuit at the $(4i-1)^{th}$ stage. The sixth sub-clock signal line CLKD_4 provides a fourth clock signal to the shift register circuit at the $4i^{th}$ stage. As shown in FIG. 8, the fourth clock signal is provided to the first shift register circuit SC1 and the fifth shift register circuit SC5 (not shown) via the third sub-clock signal line CLKD_1. The fourth clock signal is provided to the second shift register circuit SC2 and the sixth shift register circuit SC6 (not shown) via the fourth sub-clock signal line CLKD_2. The fourth clock signal is provided to the third shift register circuit SC3 and the seventh shift register circuit SC7 (not shown) via the fifth sub-clock signal line CLKD_3. The fourth clock signal is provided to the fourth shift register circuit SC4 and the eighth shift register circuit SC8 (not shown) via the sixth sub-clock signal line CLKD_4.

Furthermore, the gate driving circuit 30 may further include a seventh sub-clock signal line CLKE_1, an eighth sub-clock signal line CLKE_2, a ninth sub-clock signal line CLKE_3, and a tenth sub-clock signal line CLKE_4. In an embodiment, the seventh sub-clock signal line CLKE_1 provides a fifth clock signal to the shift register circuit at the $(4i-3)^{th}$ stage. The eighth sub-clock signal line CLKE_2 provides a fifth clock signal to the shift register circuit at the $(4i-2)^{th}$ stage. The ninth sub-clock signal line CLKE_3 provides a fifth clock signal to the shift register circuit at the $(4i-1)^{th}$ stage. The tenth sub-clock signal line CLKE_4 provides a fifth clock signal to the shift register circuit at the $4i^{th}$ stage. As shown in FIG. 8, the fifth clock signal is provided to the first shift register circuit SC1 and the fifth shift register circuit SC5 (not shown) via the seventh sub-clock signal line CLKE_1. The fifth clock signal is provided to the second shift register circuit SC2 and the sixth shift register circuit SC6 (not shown) via the eighth sub-clock signal line CLKE_2. The fifth clock signal is provided to the third shift register circuit SC3 and the seventh shift register circuit SC7 (not shown) via the ninth sub-clock signal line CLKE_3. The fifth clock signal is provided to the fourth shift register circuit SC4 and the eighth shift register circuit SC8 (not shown) via the tenth sub-clock signal line CLKE_4.

It should be noted that the cascaded relationship shown in FIG. 8 is only for exemplary purpose. According to the description of the present disclosure, other cascaded manners may also be implemented according to actual situation.

The working process of the gate driving circuit 30 shown in FIG. 8 can be described below with reference to the timing diagram of signals in FIG. 9. In an embodiment, the shift register (such as, A1, A2, etc.) in the gate driving circuit 30 is configured with a circuit structure of the shift register shown in FIG. 3, for example.

Figure 9:
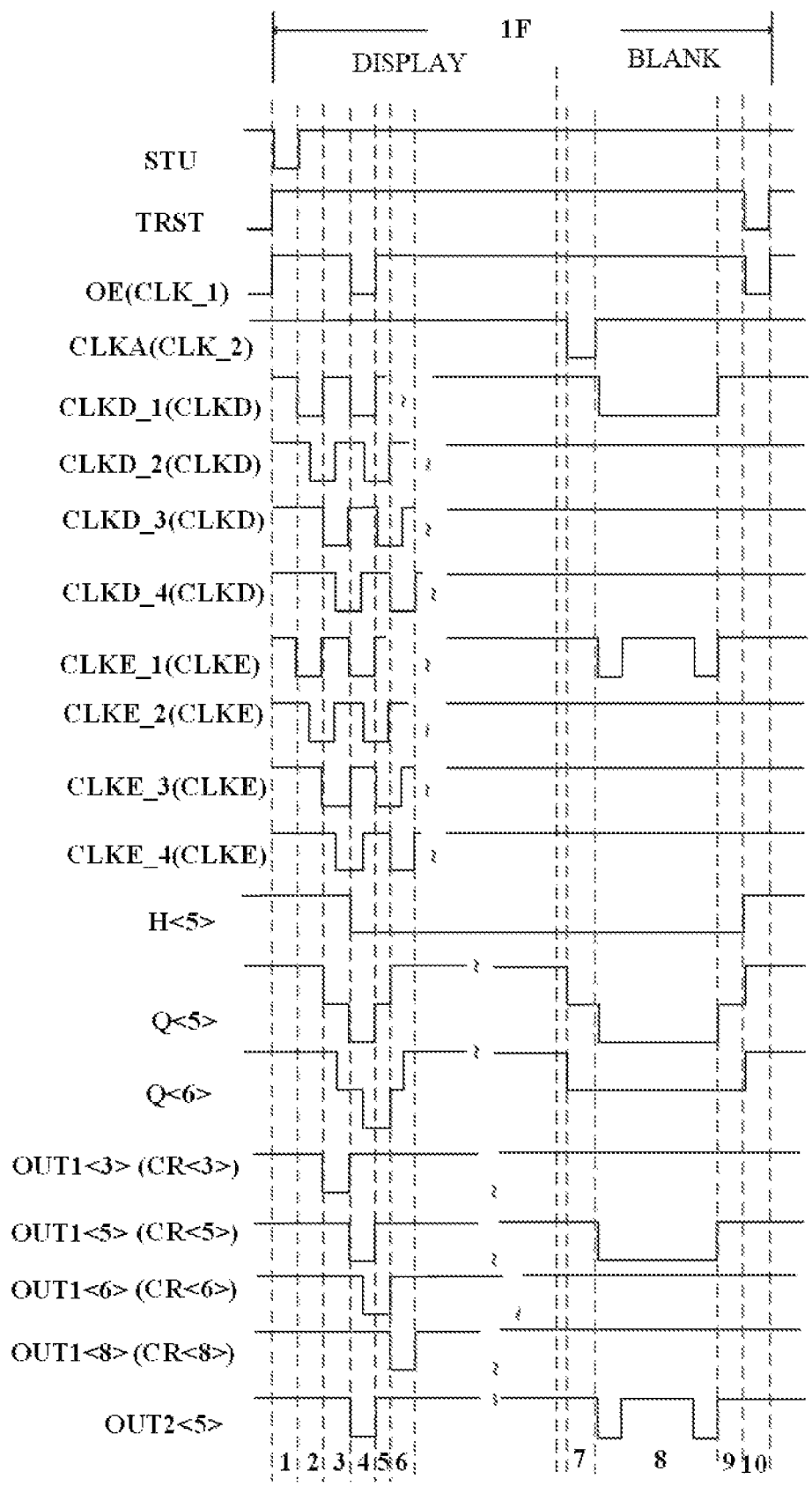
FIG. 9 shows a timing chart of signals during an operation of a gate driving circuit according to an embodiment of the present disclosure.

FIG. 9 shows a diagram for illustrating timing sequences of signals in the gate driving circuit 30 shown in FIG. 8, which is arranged to randomly compensate the fifth row of sub-pixels in the display panel. The signal STU represents the input signal STU. TRST indicates a signal provided to the blanking reset signal line TRST. The signals OE and CLKA represent the signals provided to the first sub-clock signal line CLK_1 and the second sub-clock signal line CLK_2, respectively. The signals CLKD_1, CLKD_2, CLKD_3, and CLKD_4 represent, respectively, signals provided to the third sub-clock signal line CLKD_1, the fourth sub-clock signal line CLKD_2, the fifth sub-clock signal line CLKD_3, and the sixth sub-clock signal line CLKD_4. The signals CLKE_1, CLKE_2, CLKE_3, and CLKE_4 represent, respectively, signals provided to the seventh sub-clock signal line CLKE_1, the eighth sub-clock signal line CLKE_2, the ninth sub-clock signal line CLKE_3, and the tenth sub-clock signal line CLKE_4.

H<5> represents the voltage of the first control node H in the third shift register A3 in the gate driving circuit 30, to provide the blanking input signal to the fifth shift register circuit SC5 and the sixth shift register circuit SC6 (which are not shown). Q<5> and Q<6> represent the voltages of the first node Q in the fifth shift register circuit SC5 and the sixth shift register circuit SC6, respectively.

OUT1<1>, OUT1<3>, OUT1<5>, and OUT1<8> represent the respective first drive signal output terminal OUT1 of the first shift register circuit SC1, the third shift register circuit SC3, the fifth shift register circuit SC5, and the eighth shift register circuit SC8 in the gate drive circuit 30, respectively. OUT2<5> represents the second drive signal output terminal OUT2 of the fifth shift register circuit SC5 in the gate driving circuit 30. It can be noted that the voltage of the shift signal output terminal CR is the same as the voltage of the first drive signal output terminal OUT1 in the same shift register circuit.

In addition, as described above, the transistors shown in FIG. 3 are all P-type transistors. The first voltage V1 is at a low level, and the second voltage V2 is at a high level. The third voltage V3 and the fourth voltage V4 is alternately provided with a low level.

It can be understood that the signal levels in the diagram of the timing sequences shown in FIG. 9 are only illustrative and do not represent the actual level values.

As shown in FIG. 9, one frame 1F includes a displaying phase and a blanking phase. Before the start of the frame 1F, the blanking reset signal line TRST and the first sub-clock signal line CLK_1 both provide low-level signals. Thus, each shift register is provided with a low-level blanking reset signal TRST and a low-level compensation selection control signals OE. The first transistors M1 in the respective shift registers and the fifth transistors M5 in the respective shift register circuits are turned on. Therefore, the blanking input signal STU (i.e., the input signal STU at a high level) is provided to the first control node H, to control the voltage of the first control node H to be a high level. The second voltage V2 (high level) is provided to the first node Q, to control the voltage of the first node Q to be a high level. As a result, the first control nodes H and the first nodes Q at the respective stages are all reset, thereby implementing a global reset.

Then, the frame 1F starts, the third voltage V3 is at a high level, and the fourth voltage V4 is at a low level. The seventh transistor M7 is turned off. The tenth transistor M10 is turned on. The signal provided by the blanking reset signal line TRST becomes high level. The fifth transistor M5 is turned off.

The working process of random scanning the fifth shift register circuit SC5 (in the third shift register A3) in the gate driving circuit 30 will be described below in details. The compensation selection circuit 100 in the third shift register A3 receives the compensation selection control signal OE and the shift signal CR<5> from the fifth shift register circuit SC5. The fifth shift register circuit SC5 receives the shift signal CR<3>, as the display input signal STU, from the third shift register circuit SC3. The fifth shift register circuit SC5 receives the shift signal CR<8>, as the display reset signal STD, from the eighth shift register circuit SC8.

In the displaying phase (Display) of the frame 1F, the working process of the first shift register circuit SC1 is described as follows.

In the first period (1), the display input signal terminal of the first shift register circuit SC1 is provided with a low-level display input signal STU. The fourth transistor M4 is turned on, such that the first node Q<1>in the first shift register circuit SC1 can be pulled down to a low level via the first voltage V1, and held by the second capacitor C2. The nineteenth transistor M19, the twenty-second transistor M22, and the twenty-fifth transistor M25 are turned on under the control of the voltage of the first node Q<1>. As the voltage of the fourth clock signal terminal CLKD (coupled to the third sub-clock signal line CLKD_1) and the voltage of the fifth clock signal terminal CLKE (coupled to the seventh sub-clock signal line CLKE_1) are both at the high level, the shift signal CR <1>, the first drive signal OUT1<1>, and the second drive signal OUT2<1> are output at the high level in the first shift register circuit SC1.

In the second period (2), the fourth clock signal terminal CLKD is provided with a low-level signal. The potential of the first node Q<1> is further pulled down due to the bootstrapping effect. Therefore, the nineteenth transistor M19, the twenty-second transistor M22, and the twenty-fifth transistor M25 remains enabled, such that both the shift signal output terminal CR<1> and the first drive signal output terminal OUT1<1> output low-level signals. For example, the low-level signal from the shift signal output terminal CR<1> can be configured for the shifting of scanning the upper and lower shift register circuits. The low-level signals from the first drive signal output terminal OUT1<1>and the second drive signal output terminal OUT2<1> can be configured to drive the sub-pixel units in a display panel for displaying.

In the third period (3), the fourth clock signal terminal CLKD is provided with a high-level signal. Because the first node Q<1> remains at low level, the nineteenth transistor M19, the twenty-second transistor M22, and the twenty-fifth transistor M25 are maintained to be turned on. Therefore, the shift signal CR<1>, the first drive signal OUT1<1>, and the second drive signal OUT2<1> are all at a high level. Due to the bootstrapping effect of the second capacitor C2, the potential of the first node Q <1> may also be increased.

In the fourth period (4), as the display reset signal terminal STD of the first shift register circuit SC1 is coupled to the shift signal output terminal CR<4> of the fourth shift register circuit SC4, while the shift signal output terminal CR<4> of the fourth shift register circuit SC4 outputs a low level signal, the display reset signal terminal STD of the first shift register circuit SC1 is provided with a low level signal. Thus, the sixth transistor M6 in the first shift register circuit SC1 is turned on. The first node Q<1> is pulled up to a high level. In this situation, resetting of the first node Q<1> is completed. Since the first node Q<1> is at a high level, the eleventh transistor M11 is turned off. Meanwhile, the low level at the fourth voltage terminal V4 can cause the voltage of the second pull-up node QB_B to become low level. The twelve transistor M12 is turned on, to further control the voltage of the first node Q<1> to be at a high level. Moreover, the twenty-first transistor M21, the twenty-fourth transistor M24, and the twenty-seventh transistor M27 are also turned on, such that the shift signal output terminal CR<1>, the first drive signal output terminal OUT1<1>, and the second drive signal output terminal OUT2 <1> are further pulled up.

After the display of the sub-pixels in the first row of the display panel is completed by the first shift register circuit, the second shift register circuit, the third shift register circuits, and the like, drives the sub-pixels in the display panel row by row to implement the display drive of the frame. Therefore, the displaying phase of the frame 1F is accomplished.

In this situation, the pull-up control node H is also charged in the displaying phase Display of the first frame 1F. For example, when the fifth row of sub-pixels needs to be compensated in the first frame 1F, the following operations can also be performed in the displaying phase of the first frame 1F. The working process of the fifth shift register circuit SC5 and related shift register circuits can be described below.

In the third period (3), the third shift register circuit SC3 outputs a low-level shift signal CR<3>, such that the display input signal STU of the fifth shift register circuit SC5 is at a low level. The fourth transistor M4 is turned on, to provide the first voltage V1 to the first node Q<5>. The voltage of the first node Q<5> becomes a low level. Therefore, the eighth transistor M8 and the eleventh transistor M11 are turned on. The first pull-up node QB_A and the second pull-up node QB_B are pulled up to high level by the high-level second voltage V2. Furthermore, because the display input signal STU is at a low level, the fifteenth transistor M15 and the eighteenth transistor M18 are turned on, to provide the high-level second voltage V2 to the first pull-up node QB_A and the second pull-up node QB_B, respectively. Thus, the first pull-up node QB_A and the second pull-up node QB_B can also be pulled up in an assisted manner. In this situation, the twentieth transistor M20, the twenty-first transistor M21, the twenty-third transistor M23, the twenty-fourth transistor M24, the twenty-sixth transistor M26, and the twenty-seventh transistor are turned off, respectively.

Moreover, the first node Q<5> is at a low level. The nineteenth transistor M19, the twenty-second transistor M22, and the twenty-fifth transistor M25 are turned on. The fourth clock signal CLKD (coupled to the third sub-clock signal line CLKD_1) is provided to the shift signal output terminal CR, the first drive signal output terminal OUT1<5>. The fifth clock signal CLKE (coupled to the seventh sub-clock signal line CLKE_1) is provided to the second drive signal output terminals OUT2<5>. Therefore, the respective output terminals output high-level signals respectively.

In the fourth period (4), the display input signal STU is at a high level. The fourth transistor M4 is turned off. The first node Q<5> is maintained at a low level by the second capacitor C2. A low-level signal is provided to the fourth clock signal terminal CLKD via the third sub-clock signal line CLKD_1, while a low-level signal is provided to the fifth clock signal terminal CLKE via the seventh sub-clock signal line CLKE_1. The voltage at the first node Q<5> is further pulled down due to the bootstrapping effect. The nineteenth transistor M19, the twenty-second transistor M22, and the twenty-fifth transistor M25 remain enabled, such that the low-level signals are output via the shift signal output terminal CR<5>, the first drive signal output terminal OUT1<5>, and the second drive signal output terminal OUT2<5>. Moreover, the first pull-up node QB_A and the second pull-up node QB_B remain at high level. The twentieth transistor M20, the twenty-first transistor M21, the twenty-third transistor M23, the twenty-fourth transistor M24, the twenty-sixth transistor M26 and the twenty-seventh transistor remain disabled.

In addition, in the third shift register A3, the shift signal CR (OUT1<5>) of the fifth shift register circuit SC5 is provided to the compensation selection circuit 100 (that is, the first electrode of the first transistor M1). The timing sequence of the compensation selection control signal OE at the displaying phase is configured to be the same as the timing sequence of the shift signal CR (OUT1<5>). In the fourth period (4), the compensation selection control signal OE is provided with a low-level signal. In this situation, the first transistors M1 in all of the shift registers are turned on. As the first electrode of the first transistor M1 in the third shift register A3 receives the low-level shift signal CR (OUT1<5>), the first control node H<5> of the third shift register A3 becomes low level. In this case, in the third shift register A3, a low-level blanking input signal is provided to the holding circuit 200, the fifth shift register circuit SCS, and the sixth shift register circuit SC6 via the first control node H<5>. Therefore, the blanking input signal is maintained by the first capacitor C1, such that the voltage of the first control node H<5> is held at a low level.

In the fifth period (5), the nineteenth transistor M19, the twenty-second transistor M22, and the twenty-fifth transistor M25 remain enabled. A high-level signal is provided to the fourth clock signal terminal CLKD via the third sub-clock signal line CLKD_1, while a high-level signal is provided to the fifth clock signal terminal CLKE via the seventh sub-clock signal line CLKE_1. Thus, the high-level signals are output via the shift signal output terminal CR<5>, the first drive signal output terminal OUT1<5>, and the second drive signal output terminal OUT2<5>. Due to the voltage difference across the second capacitor C2 and the third capacitor C3 unchanged, the voltage at the first node Q<5>may rise by a certain amplitude, but still be a low level. In this case, because the display reset signal STD (that is, OUT1<8>) is at a high level, the first node Q<5> is not pulled up. The pull-up node Q can be maintained at a lower level.

In the sixth period (6), the eighth shift register circuit SC8 outputs a low-level shift signal CR<8>, such that the display reset signal STD of the fifth shift register circuit is a low-level signal. The sixth transistor M6 is turned on. Therefore, the voltage of the first node Q<5> is reset to a high level. Moreover, as the voltage of the first node Q<5> is at a high level, the eleventh transistor M11 is turned off. The voltage of the second pull-up node QB_B is pulled down to a low level via the tenth transistor M10. As a result, the twelfth transistor M12 is turned on to eliminate the noise at the first node Q<5>. In addition, the twenty-first transistor M21, the twenty-fourth transistor M24, and the twenty-seventh transistor M27 are turned on, to provide the second voltage V2 to the shift signal output terminal CR<5>, the first drive signal output terminal OUT1<5>, and the second drive signal output terminal OUT2<5>. Therefore, high-level signals are output via the output terminals, respectively.

In the displaying phase of the frame 1F described above, because the first clock signal CLKA has been held at a low level, the third transistor M3 is maintained disabled. The third transistor M3 can isolate the influence of the first control node H on the first node Q.

In the displaying phase, similar to the working process of the fifth shift register circuit SC5 as described above, the sixth shift register circuit SC6 also receives the blanking input signal via the first control node H from the compensation selection circuit 100 of the third shift register A3. The sixth shift register circuit SC6 outputs the shift signal and the drive signals according to the fourth clock signal CLKD provided by the fourth sub-clock signal line CLKD_2 and the fifth clock signal CLKE provided by the eighth sub-clock signal line CLKE_2.

Then, the blanking phase (Blank) of the frame 1F starts. In the seventh period (7), the first control node H<5> is held at a low level, thus the second transistor M2 is turned on. The first clock signal CLKA is a low-level signal. The third transistor M3 is turned on. Therefore, the first voltage V1 of the first voltage terminal is provided to the first node Q<5>, such that the voltage of the first node Q<5> becomes a low level. During this period, the voltages of the fourth clock signal terminal CLKD and the fifth clock signal terminal CLKE are both at high levels. The shift signal output terminal CR<5>, the first drive signal output terminal OUT1<5>, and the second drive signal terminals OUT2<5> are output at high levels.

In the eighth period (8), the voltage of the first control node H<5> remains at low, thus the second transistor M2 is turned on. The first clock signal CLKA becomes a high-level signal, thus the third transistor M3 is turned off. In this situation, the output circuit can output the respective drive signals according to the respective clock signals, to drive the sensing transistors to work. As shown in FIG. 9, the fourth clock signal CLKD provided by the third sub-clock signal line CLKD_1 is a low-level signal, such that the voltage level of the first node Q<5> is further decreased. The shift signal CR<5> and the first drive signal OUT1<5> are both at low level. In this case, the first drive signal OUT1<5> at the low level can drive the sensing transistor in the fifth row of sub-pixels in the display panel to sense the driving currents of the sub-pixels in this row. Therefore, the compensation can be made based on the sensed driving currents. Moreover, the second drive signal output terminal OUT2<5> outputs the second drive signal under the control of the fifth clock signal CLKE provided by the seventh sub-clock signal line CLKE_1.

In addition, the sixth shift register circuit SC6 is provided with the high-level fourth clock signal CLKD via the fourth sub-clock signal line CLKD_2 and the high-level fifth clock signal CLKE via the eighth sub-clock signal line CLKE_2, thus the sixth shift register circuit SC6 outputs the high-level first drive signal OUT1<6> and the high-level second drive signal OUT2<6>. Therefore, although the first pull-up node H<5> in the third register A3 is still at a low level, the sixth row of sub-pixels may not be compensated.

It can be understood that, the fifth shift register circuit SC5 and the sixth shift register circuit SC6 both receive the blanking input signal (corresponding to the voltage of H<5>) from the compensation selection module 100 in the third shift register A3. If the fifth and sixth rows of sub-pixels needs to be compensated at the same time during a blanking phase of a frame, the respective clock signals provided by the corresponding sub-clock signal lines can be configured correspondingly, such that the sixth shift register circuit SC6 can also output the corresponding drive signals under the control of the clock signals during the blanking phase. Therefore, the corresponding sensing transistors can be driven to work, thereby realizing compensation for the sixth row of sub-pixels. Based on this, the gate driving circuit 30 can compensate multiple rows of sub-pixels simultaneously.

In the ninth period (9), the fourth clock signal CLKD and the fifth clock signal CLKE are both at high. The high-level signals are output via the shift signal output terminal CR<5>, the first drive signal output terminal OUT1<5>, and the second drive signal output terminal OUT2<5>. Due to the voltage difference across the second capacitor C2 and the third capacitor C3 unchanged, the voltage of the first node Q<5> rises by a certain amplitude, but is still a low level.

In the tenth period (10), the blanking reset signal line TRST provides a low level signal to the blanking reset signal terminal TRST. The fifth transistor M5 is turned on, to reset the first node Q<5> to a high level. The compensation selection control signal OE is also at a low level. The first transistor M1 is turned on. The voltage of the first control node H<5> is reset with the high-level shift signal CR<5>.

The driving timing of the frame 1F ends. For the driving process of the gate driving circuit in the subsequent phases such as other frames, reference can be made to the above description, and is not repeated here.

It can be noted that, in the above description of the working principle of random compensation, illustration is made based on the example of outputting the driving signal for the fifth row of the sub-pixels of the display panel in the blanking phase of the first frame. However, the present disclosure is not limited thereto. For example, in a case that the $i^{th}$ row of sub-pixels of the display panel needs to be compensated in a blanking phase of a certain frame, in a displaying phase of the frame, the timing sequence of the compensation selection control signal OE is configured to be the same as the timing sequence of the shift signal CR received by the compensation selection circuit of the shift register comprising the $i^{th}$ shift register circuit, to control and maintain the voltage of the first control node of the shift register. Then, in the blanking phase, the $i^{th}$ shift register circuit is arranged to output the drive signals to drive the sensing transistor to work under corresponding controls, thereby performing compensation for the $i^{th}$ row of the sub-pixels. It should be noted that two signals with the same timing sequence means that both signals are at low level during the same time period, and does not require that the amplitudes of the two signals are exactly the same.

For the other aspects, an array substrate is also provided according to embodiments of the present disclosure. The array substrate may include a gate driving circuit according to an embodiment of the present disclosure. Moreover, a display device including the array substrate described above is also provided according to embodiments of the present disclosure. In embodiments, the display device may include a liquid crystal panel, a liquid crystal television, a display, an OLED panel, an OLED television, a electronic paper display device, a mobile phone, a tablet, a notebook computer, a digital photo frame, a navigator, and any other product or component having a display function.

In addition, a method for driving a shift register is also provided according to embodiments of the present disclosure.

Figure 10:
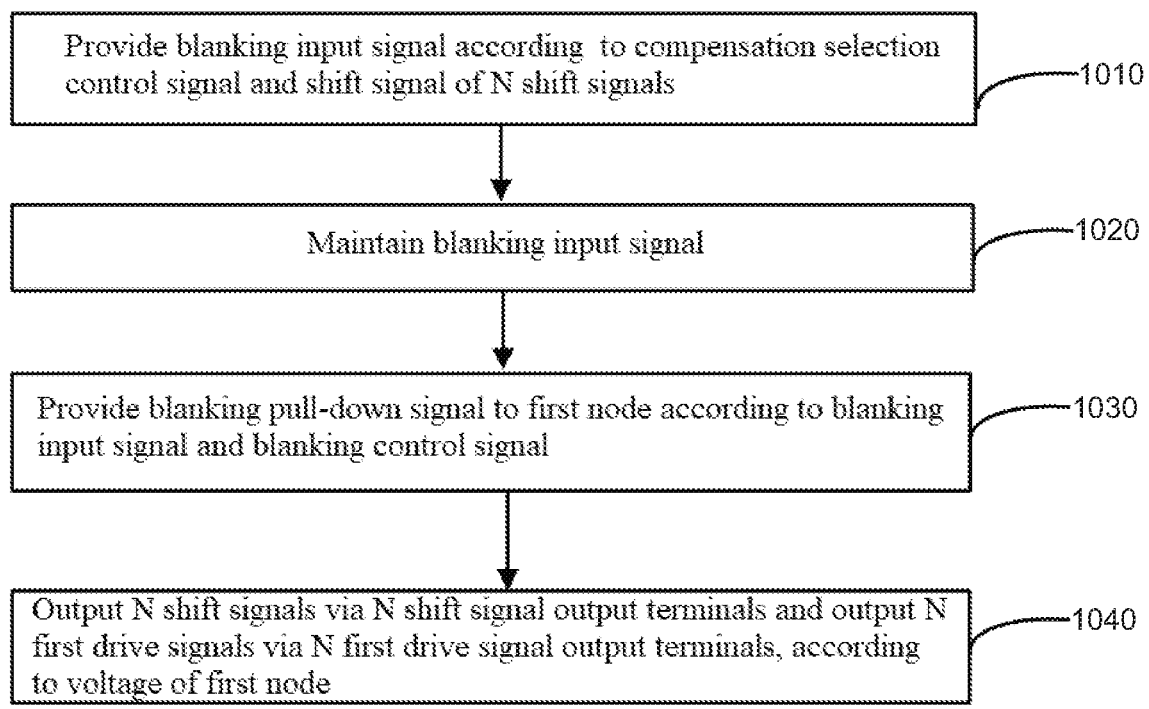
FIG. 10 shows a schematic flowchart of a method for driving a shift register according to an embodiment of the present disclosure.

FIG. 10 shows a schematic flowchart of a method for driving a shift register according to an embodiment of the present disclosure. The shift register may be any applicable shift register based on the embodiments of the present disclosure.

In step 1010, a compensation selection circuit may provide a blanking input signal, according to a compensation selection control signal and a shift signal of N shift signals from N shift signal output terminals, to a holding circuit and shift register circuits. In an embodiment, in a case that compensation needs to be made to a certain row of sub-pixels, the timing sequence for controlling the compensation selection control signal is configured to be the same as the timing sequence of the shift signal received by the compensation selection circuit of the shift register including the corresponding shift register circuit, in step 1010. Therefore, the voltage of the first control node of the shift register can be controlled. Then, the compensation selection circuit provides the received shift signal, as the blanking input signal, to the holding circuit and the shift register circuits according to the compensation selection control signal.

In step 1020, the holding circuit may maintain the blanking input signal.

Moreover, in an embodiment, a display input circuit may provide a display pull-down signal to a first node according to the display input signal in the displaying phase. According to the voltage of the first node, N shift signals are output via the N shift signal output terminals, and N first drive signals are output via the N first drive signal output terminals. The first drive signal can be configured to drive the sub-pixels for display.

In step 1030, a blanking input circuit may provide a blanking pull-down signal to the first node according to the blanking input signal and a blanking control signal.

In step 1040, according to the voltage of the first node, N shift signals are output via the N shift signal output terminals, and N first drive signals are output via the N first drive signal output terminals. Therefore, the first drive signal can be configured to compensate the sub-pixels.

Those skilled in the art can understand that although the above steps are described in order, the sequences of the steps in method are not limited thereto. The embodiments of the present disclosure may be implemented in any other suitable order.

Several embodiments of the present disclosure have been described in detail above, but the scope of protection of the present disclosure is not limited thereto. It is apparent to those of ordinary skills in the art that various modifications, substitutions, or changes may be made to the embodiments of the present disclosure without departing from the spirit and scope of the present disclosure. The scope of protection of the present disclosure is defined by the appended claims.

What is claimed is:

1. A shift register comprising a compensation selection circuit, a holding circuit, and N shift register circuits;
   wherein the holding circuit is coupled to the compensation selection circuit and the N shift register circuits via a first control node, and is configured to hold a blanking input signal, wherein the holding circuit comprises a first capacitor, wherein a first end of the first capacitor is coupled to the first control node, and wherein another end of the first capacitor is coupled to a second voltage terminal to receive a second voltage;
   each of the N shift register circuits comprises:
      a blanking input circuit coupled to the holding circuit via the first control node, and configured to provide a blanking pull-down signal to a first node according to the blanking input signal and a blanking control signal, wherein the blanking input circuit comprises a second transistor and a third transistor, wherein a control electrode of the second transistor is coupled to the first control node, wherein a first electrode of the second transistor is coupled to a first voltage terminal to receive a first voltage as the blanking pull-down signal, wherein a second electrode of the second transistor is coupled to a first electrode of the third transistor, wherein a control electrode of the third transistor is coupled to a first clock signal terminal to receive a first clock signal as the blanking control signal, and wherein a second electrode of the third transistor is coupled to the first node;
      an output circuit coupled to the blanking input circuit via the first node and configured to output a shift signal via a shift signal output terminal and output a first drive signal via a first drive signal output terminal, according to a voltage of the first node;
      a first control circuit comprising a seventh transistor, an eighth transistor, a tenth transistor, and an eleventh transistor, wherein a control electrode and a first electrode of the seventh transistor are coupled to a third voltage terminal, wherein a second electrode of the seventh transistor is coupled to the first pull-up node, wherein a control electrode of the eighth transistor is coupled to the first node, wherein a first electrode of the eighth transistor is coupled to the first pull-up node, wherein a second electrode of the eighth transistor is coupled to the second voltage terminal, wherein a control electrode and a first electrode of the tenth transistor are coupled to a fourth voltage terminal, wherein a second electrode of the tenth transistor is coupled to the second pull-up node, wherein a control electrode of the eleventh transistor is coupled to the first node, wherein a first electrode of the eleventh transistor is coupled to the second pull-up node, and wherein a second electrode of the eleventh transistor is coupled to the second voltage terminal; and
      a second control circuit comprising a thirteenth transistor, a fourteenth transistor, a sixteenth transistor, and a seventeenth transistor, wherein a control electrode of the thirteenth transistor is coupled to the first clock signal terminal to receive the first clock signal as the blanking control signal, wherein a first electrode of the thirteenth transistor is coupled to a first pull-up node, wherein a control electrode of the fourteenth transistor is coupled to the first control node, wherein a first electrode of the fourteenth transistor is coupled to a second electrode of the thirteenth transistor, wherein a second electrode of the fourteenth transistor is coupled to the second voltage terminal, wherein a control electrode of the sixteenth transistor is coupled to the first clock signal terminal to receive the first clock signal as the blanking control signal, wherein a first electrode of the sixteenth transistor is coupled to the second pull-up node, wherein a control electrode of the seventeenth transistor is coupled to the first control node, wherein a first electrode of the seventeenth transistor is coupled to a second electrode of the sixteenth transistor, and wherein a second electrode of the seventeenth transistor is coupled to the second voltage terminal;
   wherein the compensation selection circuit is coupled to a compensation selection control signal terminal and a shift signal output terminal of one of the N shift register circuits, and is configured to provide, according to a compensation selection control signal from the compensation selection control signal terminal and the shift signal from the shift signal output terminal of the one of the N shift register circuits, the blanking input signal to the holding circuit and the N shift register circuits via the first control node; and
   wherein N is a natural number greater than 1.

2. The shift register according to claim 1, wherein the compensation selection circuit comprises a first transistor, wherein a control electrode of the first transistor is coupled to the compensation selection control signal terminal to receive the compensation selection control signal, wherein a first electrode of the first transistor is coupled to the shift signal output terminal of the one of the N shift register circuits, and wherein a second electrode of the first transistor is coupled to the first control node.

3. The shift register according to claim 1, wherein the output circuit comprises a nineteenth transistor, a twenty-second transistor, and a second capacitor;
   wherein a control electrode of the nineteenth transistor is coupled to the first node, wherein a first electrode of the nineteenth transistor is coupled to a fourth clock signal terminal to receive a fourth clock signal, and wherein a second electrode of the nineteenth transistor is coupled to the shift signal output terminal;

wherein a control electrode of the twenty-second transistor is coupled to the first node, wherein a first electrode of the twenty-second transistor is coupled to the fourth clock signal terminal to receive the fourth clock signal, and wherein a second electrode of the twenty-second transistor is coupled to the first drive signal output terminal; and wherein the second capacitor is coupled between the first node and the shift signal output terminal.

4. The shift register according to claim 1, wherein each of the shift register circuits further comprises a display input circuit, and wherein the display input circuit is coupled to the blanking input circuit and the output circuit via the first node and is configured to provide a display pull-down signal to the first node according to a display input signal.

5. The shift register according to claim 4, wherein the display input circuit comprises a fourth transistor, wherein a control electrode of the fourth transistor is coupled to a display input signal terminal to receive the display input signal, wherein a first electrode of the fourth transistor is coupled to the first voltage terminal to receive the first voltage as the display pull-down signal, and wherein a second electrode of the fourth transistor is coupled to the first node.

6. The shift register according to claim 1, wherein each of the shift register circuits further comprises a pull-up circuit;

wherein the pull-up circuit is coupled to the blanking input circuit and the output circuit via the first node, and is configured to provide the second voltage from the second voltage terminal to the first node, the shift signal output terminal, and the first drive signal output terminal according to the voltage of the first pull-up node and the second pull-up node.

7. The shift register according to claim 6, wherein the pull-up circuit comprises:
a ninth transistor, wherein a control electrode of the ninth transistor is coupled to the first pull-up node, wherein a first electrode of the ninth transistor is coupled to the first node, and wherein a second electrode of the ninth transistor is coupled to the second voltage terminal;
a twentieth transistor, wherein a control electrode of the twentieth transistor is coupled to the first pull-up node, wherein a first electrode of the twentieth transistor is coupled to the shift signal output terminal, and wherein a second electrode of the twentieth transistor is coupled to the second voltage terminal; and
a twenty-third transistor, wherein a control electrode of the twenty-third transistor is coupled to the first pull-up node, wherein a first electrode of the twenty-third transistor is coupled to the first drive signal output terminal, and wherein a second electrode of the twenty-third transistor is coupled to the second voltage terminal; and wherein the second control circuit further comprises:
a fifteenth transistor, wherein a control electrode of the fifteenth transistor is coupled to a display input signal terminal to receive the display input signal, wherein a first electrode of the fifteenth transistor is coupled to the first pull-up node, and wherein a second electrode of the fifteenth transistor is coupled to the second voltage terminal.

8. The shift register according to claim 7, wherein the pull-up circuit further comprises:
a twelfth transistor, wherein a control electrode of the twelfth transistor is coupled to the second pull-up node, wherein a first electrode of the twelfth transistor is coupled to the first node, and wherein a second electrode of the twelfth transistor is coupled to the second voltage terminal;
a twenty-first transistor, wherein a control electrode of the twenty-first transistor is coupled to the second pull-up node, wherein a first electrode of the twenty-first transistor is coupled to the shift signal output terminal, and wherein a second electrode of the twenty-first transistor is coupled to the second voltage terminal; and
a twenty-fourth transistor, wherein a control electrode of the twenty-fourth transistor is coupled to the second pull-up node, wherein a first electrode of the twenty-fourth transistor is coupled to the first drive signal output terminal, and wherein a second electrode of the twenty-fourth transistor is coupled to the second voltage terminal; and wherein the second control circuit further comprises:
an eighteenth transistor, wherein a control electrode of the eighteenth transistor is coupled to the display input signal terminal to receive the display input signal, wherein a first electrode of the eighteenth transistor is coupled to the second pull-up node, and wherein a second electrode of the eighteenth transistor is coupled to the second voltage terminal.

9. The shift register according to claim 8, wherein the output circuit further comprises a twenty-fifth transistor and a third capacitor;

wherein a control electrode of the twenty-fifth transistor is coupled to the first node, wherein a first electrode of the twenty-fifth transistor is coupled to a fifth clock signal terminal to receive a fifth clock signal, and wherein a second electrode of the twenty-fifth transistor is coupled to a second drive signal output terminal; and wherein the third capacitor is coupled between the first node and the second drive signal output terminal.

10. The shift register according to claim 9, wherein the pull-up circuit further comprises a twenty-sixth transistor and a twenty-seventh transistor;

wherein a control electrode of the twenty-sixth transistor is coupled to the first pull-up node, wherein a first electrode of the twenty-sixth transistor is coupled to the second drive signal output terminal, and wherein a second electrode of the twenty-sixth transistor is coupled to the second voltage terminal; and wherein a control electrode of the twenty-seventh transistor is coupled to the second pull-up node, wherein a first electrode of the twenty-seventh transistor is coupled to the second drive signal output terminal, and wherein a second electrode of the twenty-seventh transistor is coupled to the second voltage terminal.

11. The shift register according to claim 6, wherein each of the shift register circuits further comprises a reset circuit, and wherein the reset circuit is coupled to the blanking input circuit, the first control circuit, the pull-up circuit via the first node, and is configured to reset the first node according to a blanking reset signal from a blanking reset signal terminal, and a display reset signal from a display reset signal terminal.

12. The shift register according to claim 11, wherein the reset circuit comprises a fifth transistor and a sixth transistor;

wherein a control electrode of the fifth transistor is coupled to the blanking reset signal terminal, wherein a first electrode of the fifth transistor is coupled to the first node, and wherein a second electrode of the fifth transistor is coupled to the second voltage terminal; and wherein a control electrode of the sixth transistor is coupled to the display reset signal terminal, wherein a first electrode of the sixth transistor is coupled to the first node, and wherein a second electrode of the sixth transistor is coupled to the second voltage terminal.

13. The shift register according to claim 1, wherein the shift register comprises one compensation selection circuit and one holding circuit.

14. A gate driving circuit comprising M shift registers according to claim 1 and a first sub-clock signal line, wherein the compensation selection control signal is provided to each of the shift registers via the first sub-clock signal line.

15. The gate driving circuit according to claim 14, further comprising a second sub-clock signal line and a blanking reset signal line;
   wherein a shift signal from a shift register circuit at an $i^{th}$ stage is provided to the shift register circuit at an $(i+2)^{th}$ stage as a display input signal;
   wherein a first clock signal is provided to each of the shift register circuits via the second sub-clock signal line;
   wherein a blanking reset signal is provided to each of the shift register circuits via the blanking reset signal line; and
   wherein a shift signal from the shift register circuit at an $(i+3)^{th}$ stage is provided to the shift register circuit at the $i^{th}$ stage as a display reset signal.

16. The gate driving circuit according to claim 14, further comprising a third sub-clock signal line, a fourth sub-clock signal line, a fifth sub-clock signal line, and a sixth sub-clock signal line;
   wherein a fourth clock signal is provided to a shift register circuit at a $(4i-3)^{th}$ stage via the third sub-clock signal line;
   wherein the fourth clock signal is provided to the shift register circuit at a $(4i-2)^{th}$ stage via the fourth sub-clock signal line;
   wherein the fourth clock signal is provided to the shift register circuit at a $(4i-1)^{th}$ stage via the fifth sub-clock signal line; and
   wherein the fourth clock signal is provided to the shift register circuit at a $4i^{th}$ stage via the sixth sub-clock signal line.

17. The gate driving circuit according to claim 14, further comprising a seventh sub-clock signal line, an eighth sub-clock signal line, a ninth sub-clock signal line, and a tenth sub-clock signal line;
   wherein a fifth clock signal is provided to the shift register circuit at a $(4i-3)^{th}$ stage via the seventh sub-clock signal line;
   wherein the fifth clock signal is provided to the shift register circuit at a $(4i-2)^{th}$ stage via the eighth sub-clock signal line;
   wherein the fifth clock signal is provided to the shift register circuit at a $(4i-1)^{th}$ stage via the ninth sub-clock signal line; and
   wherein the fifth clock signal is provided to the shift register circuit at a $4i^{th}$ stage via the tenth sub-clock signal line.

18. A method for driving a shift register according to claim 1, the method comprising:
   providing the blanking input signal according to the compensation selection control signal and a shift signal of N shift signals;
   maintaining the blanking input signal;
   providing the blanking pull-down signal to the first node according to the blanking input signal and the blanking control signal; and
   outputting N shift signals via N shift signal output terminals and outputting N first drive signals via N first drive signal output terminals, respectively, according to the voltage of the first node.

* * * * *